(12) United States Patent
Carver

(10) Patent No.: US 6,373,335 B1
(45) Date of Patent: *Apr. 16, 2002

(54) INTEGRATED AUDIO AMPLIFIER

(76) Inventor: Robert W Carver, 330 Ave. 'A', Snohomish, WA (US) 98290

( * ) Notice: Subject to any disclaimer, the term of this patent is extended or adjusted under 35 U.S.C. 154(b) by 0 days.

This patent is subject to a terminal disclaimer.

(21) Appl. No.: 09/659,157

(22) Filed: Sep. 11, 2000

Related U.S. Application Data

(63) Continuation-in-part of application No. 09/156,329, filed on Sep. 18, 1998, now Pat. No. 6,166,605.
(60) Provisional application No. 60/059,220, filed on Sep. 18, 1997.

(51) Int. Cl.[7] ................................................ H03F 3/38
(52) U.S. Cl. ..................... 330/10; 330/207 A; 330/297; 363/24; 381/120
(58) Field of Search ............................... 330/10, 207 A, 330/251, 297; 363/24, 25, 63, 41; 381/120

(56) References Cited

U.S. PATENT DOCUMENTS 4,445,095 A * 4/1984 Carver ...................... 330/297
4,739,461 A * 4/1988 Komatsu et al. .............. 363/20
5,218,552 A * 6/1993 Phelps et al. ................ 363/124

* cited by examiner

*Primary Examiner*—Robert Pascal
*Assistant Examiner*—Henry Choe
(74) *Attorney, Agent, or Firm*—Robert B. Hughes; Hughes Law Firm, PLLC

(57) ABSTRACT

An audio amplifier comprising a power amplifier section, a power supply, and a control circuit. The power supply is made up of a positive and negative power supply section, with the positive supply section and the negative supply section delivering, respectively, positive and negative power inputs through the power amplifier section. Each power supply section comprises a transformer and a switch section to supply current pulses to the primary winding of the transformer. A filter circuit component is connected to an output of each secondary winding. The control circuit controls the strength of the current pulses of the power supply sections in accordance with the strength of the audio signal.

28 Claims, 20 Drawing Sheets

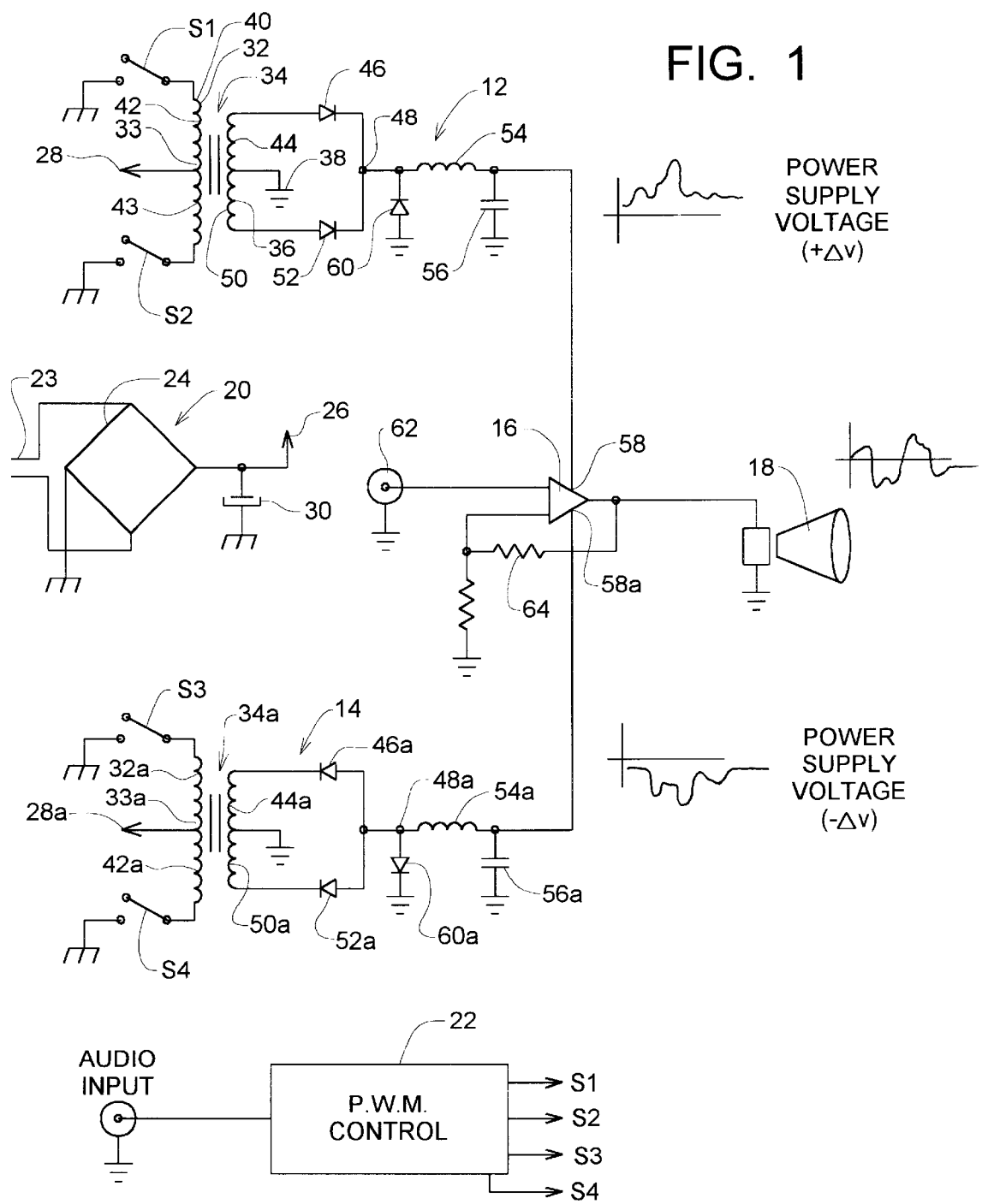

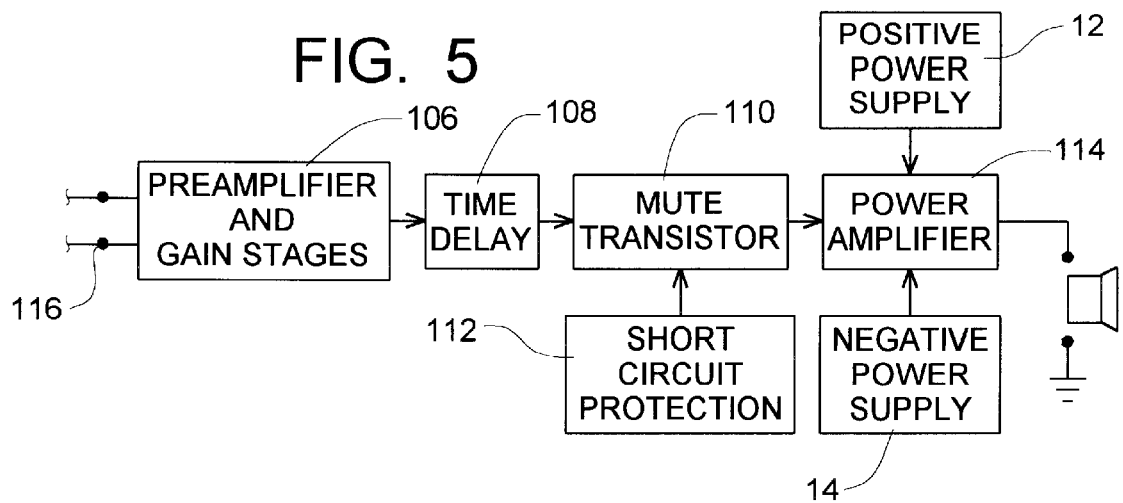

FIG. 6B
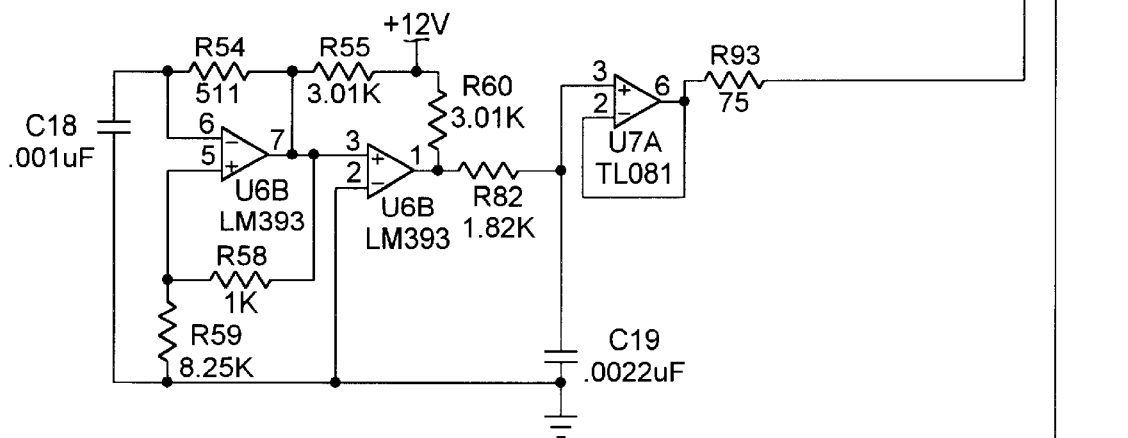
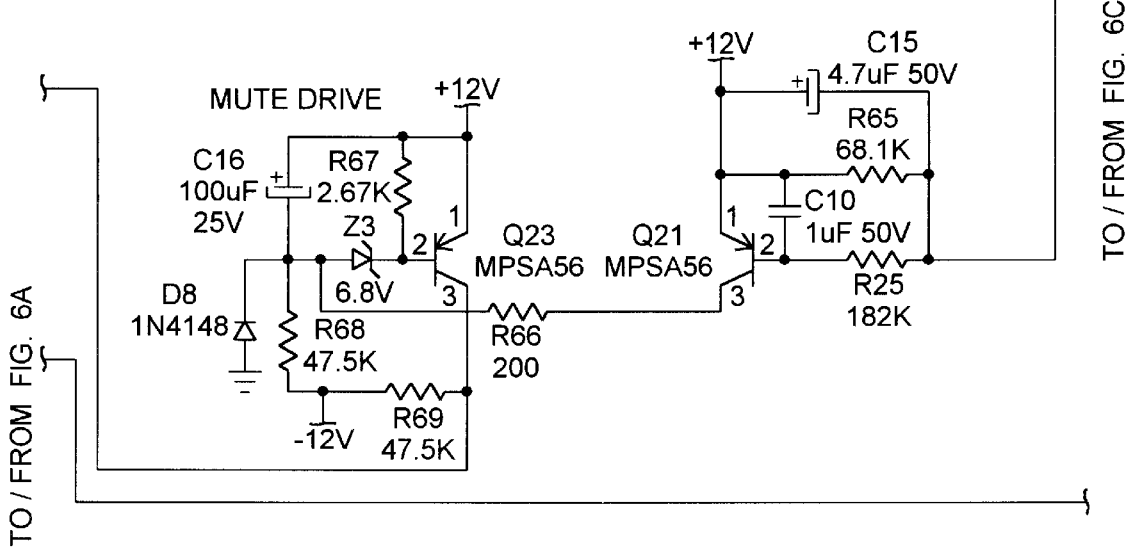
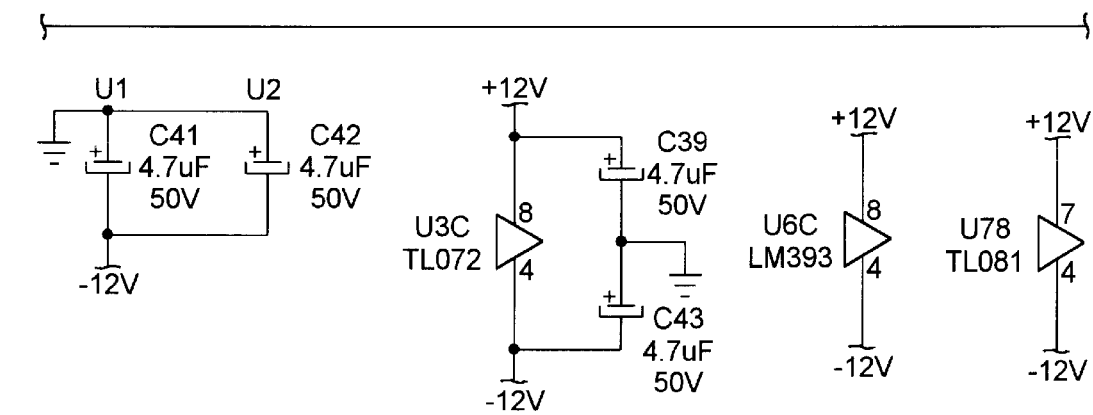

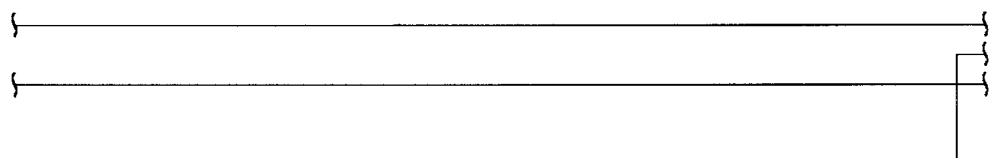
FIG. 6C
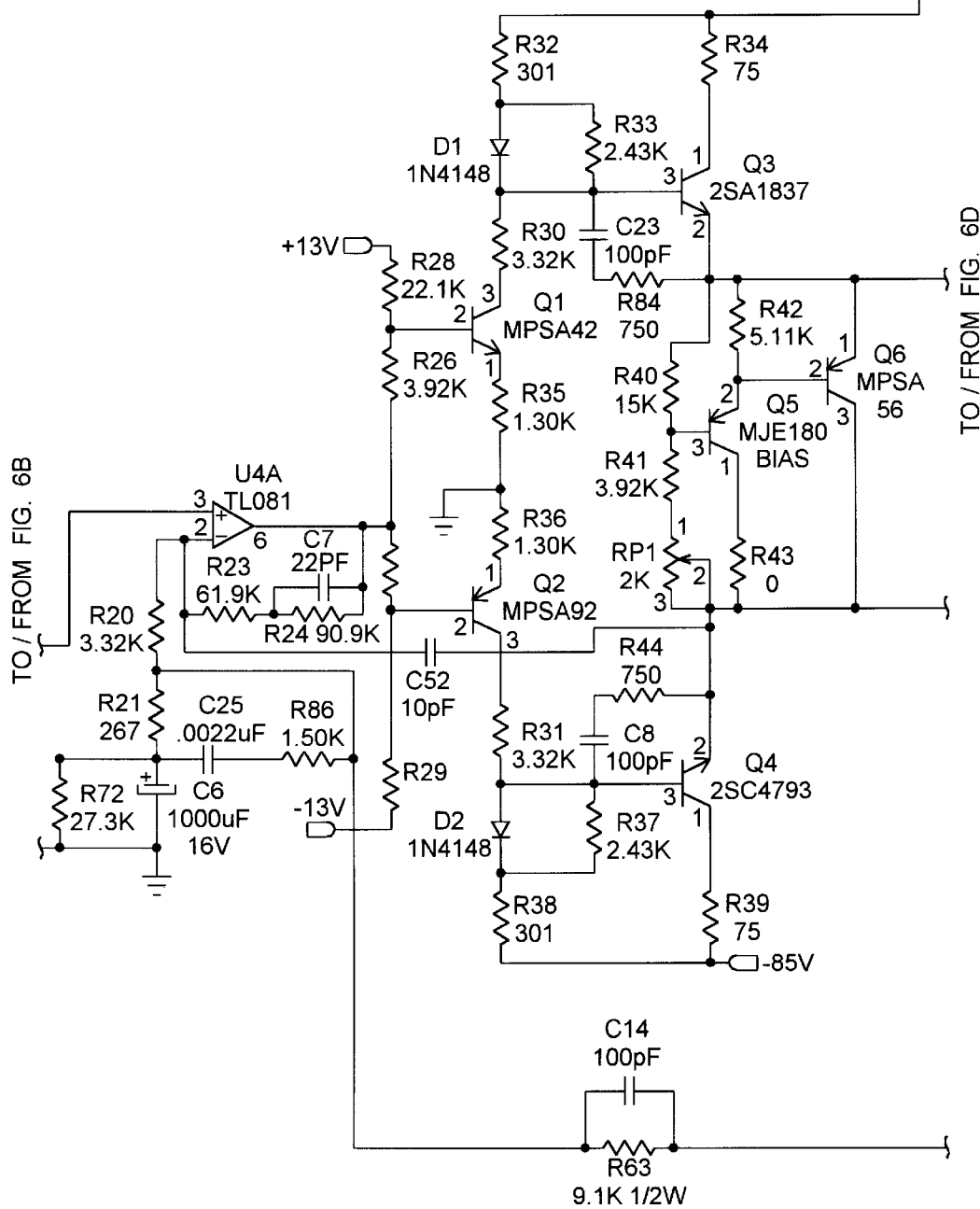

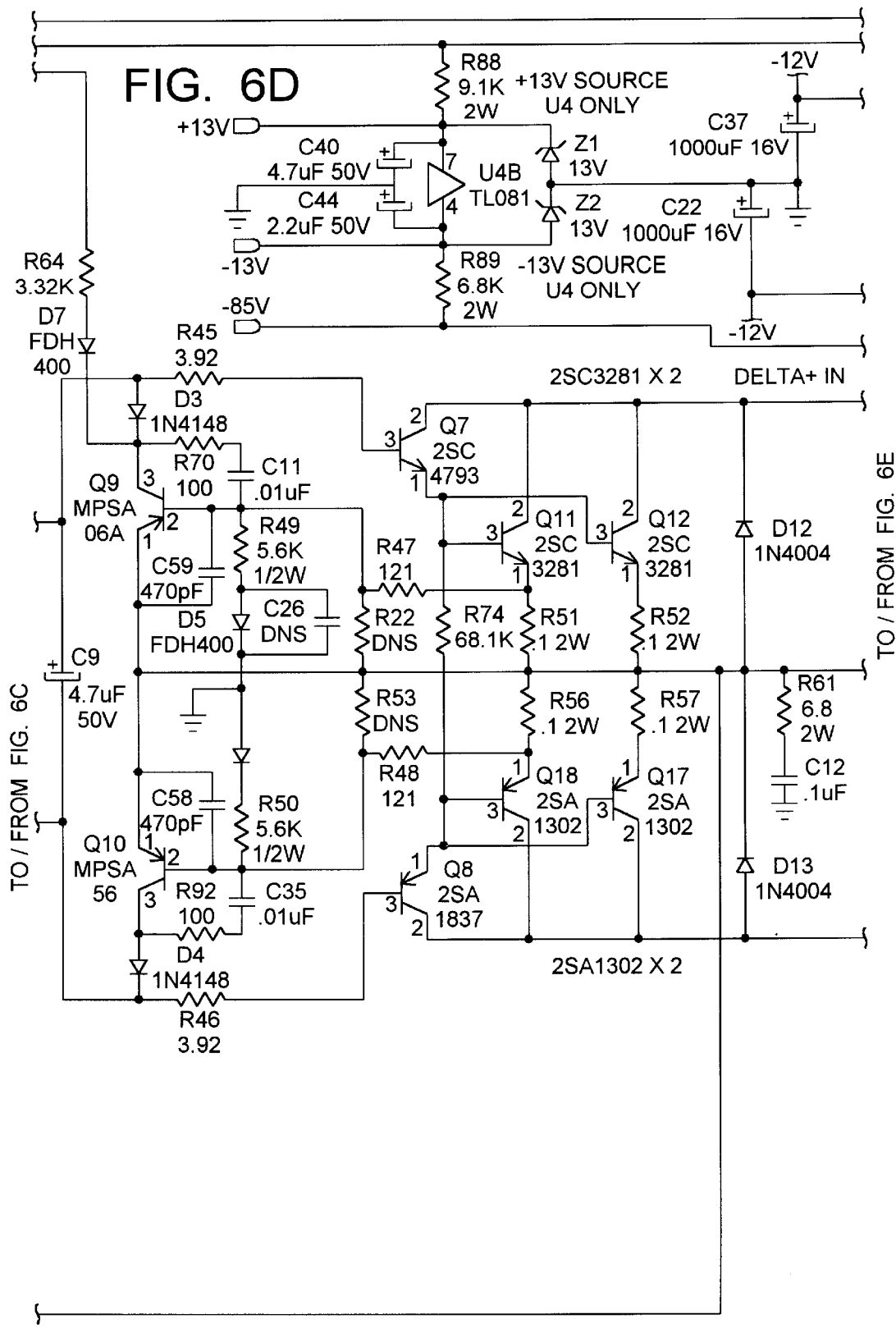

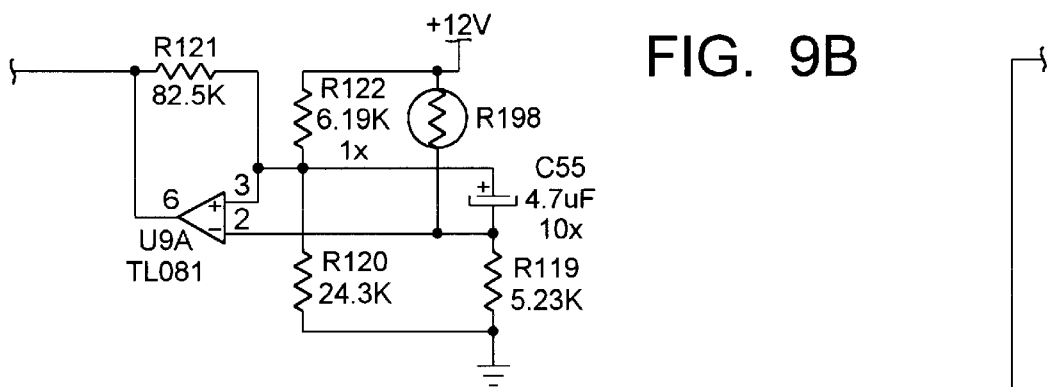
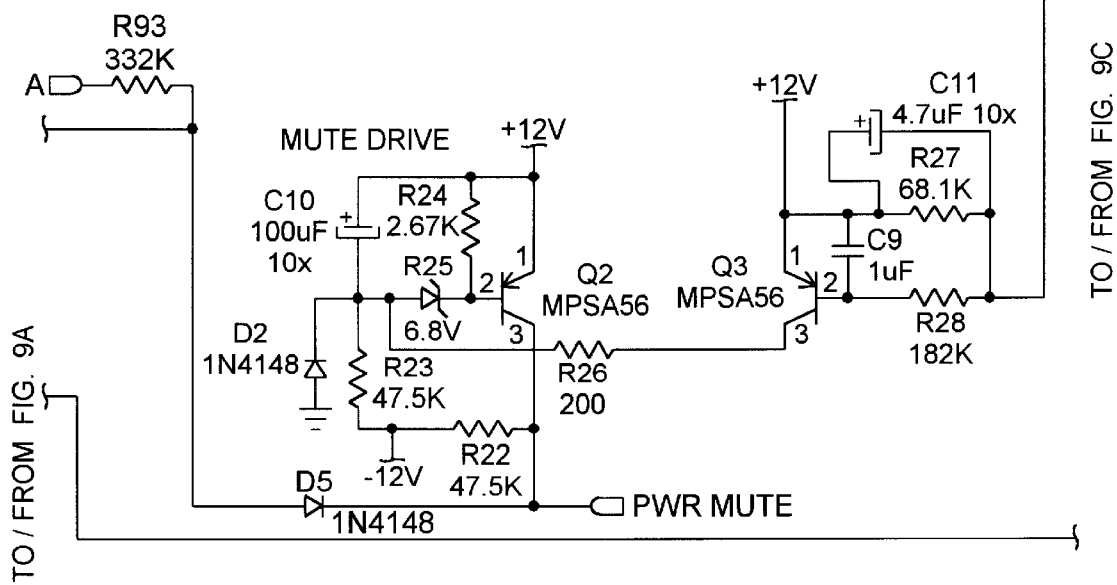
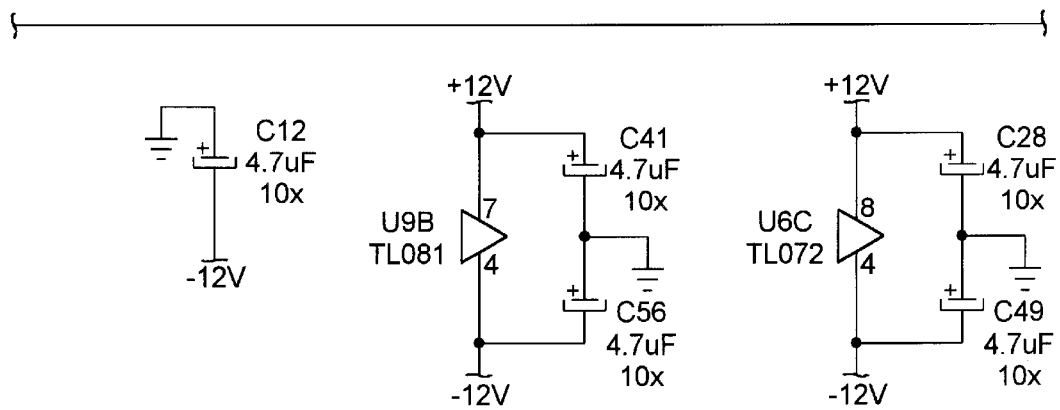
FIG. 9B

INTEGRATED AUDIO AMPLIFIER

CROSS-REFERENCE TO RELATED APPLICATIONS

This application claims priority of U.S. Provisional Patent Application Serial No. 60/059,220, which was filed on Sep. 18, 1997, and is a continuation-in-part of U.S. Ser. No. 09/156,329, filed Sep. 18, 1998 now U.S. Pat. No. 6,166,605.

BACKGROUND OF THE INVENTION a) Field of the Invention

The present invention relates to an audio amplifier and more particularly an audio amplifier which is capable of producing relatively high power output, while operating with relatively low power losses, and also being of relatively small size.

b) Background Art

An audio signal is characterized in that it comprises what might be called a series of "peaks and valleys". There are periods of high amplitude (the peaks) and also those periods of relatively low amplitude (the valleys). The total of the time periods for the "peaks" is in most all instances rather small, compared to the total of the time periods for the valleys. This is true even of music which would be considered consistently loud music, such as hard rock.

This imposes somewhat unique problems in the design of audio amplifiers, and yet provides opportunities for technical improvements. Thus, it is the object of the present invention to provide an improved audio amplifier which is of a relatively small size, operates quite efficiently, is relatively inexpensive to manufacture, and yet is capable of faithful amplification of audio signals.

SUMMARY OF INVENTION

The audio amplifier of the present invention is able to deliver relatively high power output (2,000 watts or more) and yet be small in size and operate with relatively high efficiency.

In a first embodiment this amplifier comprises a power amplifier section which receives an audio input signal and positive and negative power inputs to produce an audio output. There is also a power supply comprising a positive power supply section and a negative power supply section.

The positive power supply section comprises a transformer having a primary and a secondary winding, with a secondary winding being connected to the power amplifier section to supply positive voltage power input to the power amplifier section.

There is a power switch for the positive power supply section to supply current pulses to the primary winding. There is also a filter circuit component connected to an output of the secondary winding of the transformer to maintain the voltage of the positive power output as a continuing variable voltage input.

There is also a control circuit responsive to an audio input signal to transmit a pulsed control signal to the switch section to cause the switch section to open and close in a manner to transmit current pulses to the primary winding of the transformer. The pulses have a proportional relationship to the strength of the audio signal, so that the positive voltage input to the amplifier section tracks the audio signal in a manner to maintain the positive input voltage at a predetermined level range above voltage of the audio input.

The negative supply section also comprises a transformer, a second power switch section, and a filter circuit component. However, the negative power supply section provides a negative voltage power input to the power amplifier at a voltage below the audio signal voltage by a predetermined amount. In other respects, the negative power supply section is constructed and operates in substantially the same manner as the positive power supply section. The negative power supply section is controlled by the control circuit.

In the first embodiment, the switch section for each of the power supply sections comprises two switches connected to opposite sides of the primary winding of the transformer. The pulses of one of these switches passes through the related primary winding in one direction, while the pulses of the other switch pass through the related primary winding in an opposite direction, in an alternating sequence. An intermediate portion of each of the primary windings in connected to a power source.

Also, the secondary winding in the first embodiment is connected to ground at an intermediate location of each secondary winding.

The control circuit comprises a pulse width modulator which receives a clock input to initiate successive pulse signals. The pulse width modulator also has an audio signal input to cause the pulse width modulator to transmit pulse signals having a pulse strength with a proportional relationship to the audio signal. The positive component of the audio signal controls the first power switch section and the negative component of the audio signal controls the negative power switch section.

In the preferred form, the pulse width modulator creates square wave signal pulses, with the width of the pulses varying in accordance to the amplitude of the audio signal.

In the first embodiment, the secondary winding of the two power supply sections has two end connections and first and second diodes to receive the output at each of the end connections with the output of the diodes being directed to the power amplifier section.

The control circuit operates to close each set of first and second switches alternately, so that the current pulses from each secondary winding are transmitted alternately through the first and second diodes.

In the preferred form of the first embodiment, each filter circuit component comprises an induction coil to receive the output of the secondary, and a capacitor connected at a location between the induction coil and the amplifier section.

In the method of the first embodiment of the present invention, an audio amplifier is provided as noted above. Each pulse width modulator transmits pulses to the first and second switch sections of each power supply section, with the width of the pulses having a proportional relationship to the amplitude of the audio signal. The pulses from each set of switches is transmitted to its related transformer, which in turn transmit these pulses through the related filter circuit component and thence to the power amplifier section.

In a second embodiment of the present invention, there is, as in the first embodiment, the power amplifier section, the power supply comprising a positive power supply section and a negative power supply section, and also the control circuit. The two power supply sections differ from the first embodiment in several ways.

In each power supply section of the second embodiment, there is an amplifier having primary and secondary windings, and each primary winding has first and second switches in series with the primary winding at first and second opposite ends, respectively, of the primary winding. The amplifier and the control circuit are arranged so that the first and second switches of each power supply section open substantially simultaneously and close substantially simultaneously to cause the pulse to be transmitted through the secondary winding. The secondary winding is connected to a first diode that in turns connects to the power amplifier section to enable pulses generated in the secondary winding to travel through the first diode to the power amplifier. These are arranged so that current flows through the primary winding and the secondary winding substantially simultaneously. Each filter component comprises a capacitor connected to the first diode and the power amplifier section, and there is an induction coil. Additionally, there is a secondary diode positioned between the induction coil and the first diode which is arranged to be nonconductive when the first diode is transmitting a pulse, and to be conductive when the first diode is turned off.

The first switch of each power supply section connects to a power source, and the second switch connects toward a ground connection. A diode is connected from a location between the first end of the transformer and the second switch, toward a ground location. Also, a diode is connected from a location between the second end of the transformer and the second switch to connect toward a power connection location.

There is a third embodiment of the present invention which is rather similar to the first embodiment, except that the transformer of each power supply section is arranged in a manner that when the first and second switches of each power supply section are closed an impulse of current flows through the primary winding of the transformer, no current is flowing in the secondary winding, and after the first and second switches are opened a collapsing field of the primary winding induces current to flow through the secondary winding.

In this third embodiment, there is a diode connected between the secondary winding of each power supply section and the power amplifier section to permit current from the secondary winding of each power supply section after the current pulse has passed through the primary winding and the current pulse is induced in the secondary winding.

The control circuit of the present invention comprises a pulse width modulator which receives a clock input to initiate successive pulse signals, and having an audio signal input to the pulse width modulator to transmit pulse signals having a pulse width with a proportional relationship to the audio signal. The control circuit comprises a first control circuit portion which receives positive portions of the audio signal and generates pulse control signals corresponding to the positive audio signal portions, and a second control circuit portion which receives negative portions of the audio signal and utilizes the negative portions of the audio signal to produce pulse control signals control pulses for the negative power supply section. Also, in the preferred form, the power supply comprises a power source which delivers DC power to each of the power supply sections. Also, in the preferred form, the DC power directed to each of the power supply sections is of the same polarity.

The method of the second and third embodiments is sufficiently similar to the method of the first embodiment so that it is believed no detailed explanation of the same is needed at this portion of the text.

Other features will become apparent from the following detailed description.

BRIEF DESCRIPTION OF THE DRAWINGS

FIG. 1 is a schematic drawing of a first embodiment of the present invention;

FIGS. 4A-1 and 4A-2 are more detailed drawings of the circuit for the positive power supply;

FIGS. 4B-1 and 4B-2 are more detailed drawings of the circuit for the negative power supply;

FIG. 5 is a schematic block diagram of the final amplifier section of the present invention.

DESCRIPTION OF THE PREFERRED EMBODIMENTS

Figures 1, 4A:
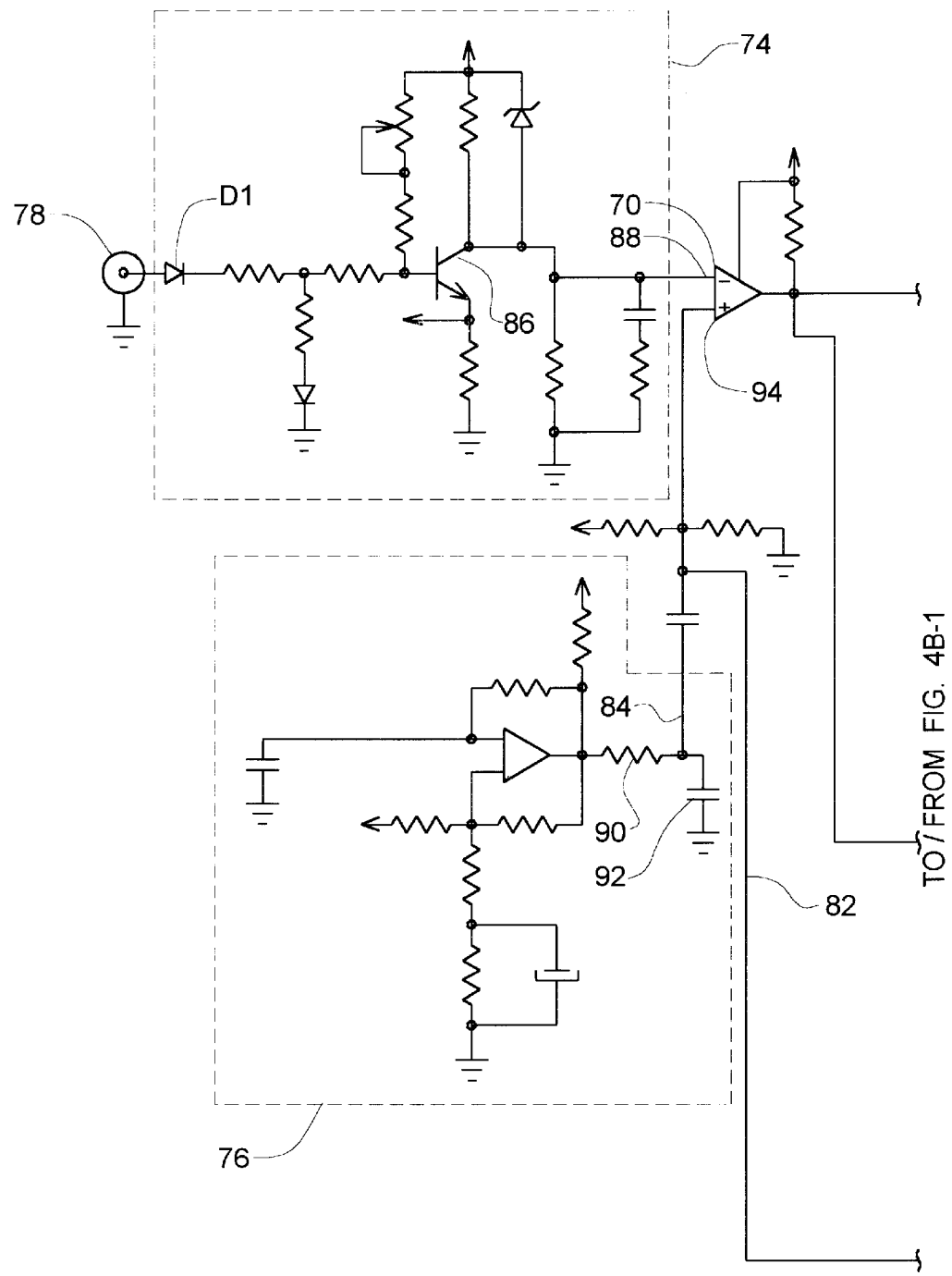

Reference will first be made to FIG. 1 which shows somewhat schematically the entire amplifier 10 of the final embodiment of the present invention. This amplifier 10 of the present invention comprises first and second power sections 12 and 14 and an amplifier unit 16 which receives power from the two power sections 12 and 14. The amplifier in turn drives a speaker 18. The amplifier further comprises a source of DC power, generally designated 20, and a P.W.M. control unit 22 (i.e. a pulse width modulation control unit). The control unit 22 can be considered as having two portions, one portion controlling the switches S1 and S2 of the first power supply 12, and the second portion controlling the switches S-3 and S-4 of the second power supply 14.

The power source 20 derives its power from a conventional wall plug 23 which directs current through a rectifying bridge 24 to provide a DC output at 26 which is directed into the power inputs 28 and 28a of each of the two power sections 12 and 14. The power source 20 is provided with a capacitor 30 to minimize the variations in the DC output.

The two power sections 12 and 14 are substantially identical, except that the power section 12 supplies power only for the positive portions of the audio signal, and the other power section 14 provides power for the negative portions of the audio signal. Accordingly, only the power section 12 will be described, with the understanding that the same description applies to the other power section 14. The components of the second power section 14 will be given designations the same as those given in the first power section 12 for corresponding components, with an "a"" suffix distinguishing those of the second power section.

The power input 28 is connected at 33 to the middle of the primary winding 32 of a transformer 34. The secondary winding 36 of the transformer is connected from its mid point to ground at 38. The upper part 40 of the primary winding 32 is connected through to a first control switch S1 to ground. The other half 42 of the primary winding 32 connects from the power input 28 to a related switch S2 to ground. The two switches S1 and S2 are closed and opened in an alternating fashion, in this preferred embodiment at a frequency of 160 kHz.

As will be described more fully later herein, these two switches S12 and S2 are duty cycle modulated, so that if greater power is required, each of the switches S1 and S2 are closed for longer periods of time during each cycle to create pulses of longer duration on the respective half cycle of each, and during periods of lower power requirements, the two switches S1 and S2 will close for only shorter periods of time to create pulses of very short duration.

The upper half 44 of the secondary winding 36 has one end connected to the center location 38, and the opposite end connected through a diode 46 to a junction point at 48. In like manner, the lower half 50 of the primary winding 36 connects from the center location 38 of the secondary winding 36 to a second diode 52 which in turn leads to the aforementioned junction location 48. The current from the junction location 48 leads through an inductance coil 54, with the output of the inductance coil 54 connecting to a capacitor 56. The coil 54 and capacitor 56 constitute a low pass filter to "smooth" the current. The current from the coil 52 is directed to the positive input terminal 58 of the amplifier unit 16. There is a diode 60 connected between the junction location 48 and the inductance coil 54. When one or the other of the diodes 46 and 52 shut off there is an inductance kick from the coil 54, and a diode 60 provides a path to ground.

As indicated above, the second power section 14 is the same as the first power section 12, except that it operates on the negative portions of the audio signal. Thus, the output from the second power section is directed to the power input connection at 58a to the amplifier unit 16.

The aforementioned control unit 22 is (or may be) conventional, and in this preferred embodiment comprises an integrated circuit which receives the audio signal from an outside source. It converts the analog audio signal into digital pulses that in turn operate the above mentioned two switches (S1 and S2) and also the corresponding switches S3 and S4 of the second power section 14. Since the same audio signal that operates the switches is applied to the input of the amplifier 16, the output of the control unit 22 will "track" the main audio signal. The control unit 22 is biased to stay just ahead of the main audio signal and has a relative output that is just "above" or "below", respectively, the plus and the negative portion of the audio signal.

As indicated above, the amplifier unit 16 is, or may be, of itself conventional. The audio input source for the amplifier unit 16 is indicated at 62, and the amplifier unit 16 has a feedback network indicated generally at 64.

To describe the overall operation of the present invention, as indicated earlier, the function of the power source 20 is to deliver DC current to the inputs 28 and 28a of the primary windings 32 and 32a of the transformers 34 and 34a, with this being accomplished by directing the alternating current from the wall plug 23 through the rectifier bridge 24 and to the two inputs 28 and 28a of the first and second power supply sections 12 and 14.

The basic operation of the two power sections is substantially the same, so only the operation of the first power section 12 will be described in detail. To continue with the description of the first power section 12, the capacitor 30 functions as a buffer and the DC current is maintained at a voltage relatively close to 165 volts. The two switches S1 and S2 open and close alternately, this being controlled by the P.W.M. Control 22. The switching frequency is constant, and a preferred frequency is 160 kHz. On one half cycle when the switch S1 is closed (with the switch S2 being open), a pulse travels through the upper part 40 of the primary winding 32, and the pulse width is determined by the time period during which the switch S1 is closed. On the alternate half cycle during which the switch S2 is closed (with the switch S12 being open, the current pulse travels through the lower half 42 of the primary winding 32, and the pulse width is determined by the time period that the switch S2 is closed.

As indicated above, the pulse widths are duty cycle modulated. The PWM section 22 is controlled by the audio input, so that if the amplitude of the audio signal is low, the pulse widths are rather small. On the other hand, when the amplitude is high, the pulse width increases proportionately. Thus, when the switch S1 is closed, the pulse traveling through the upper half 40 of the primary winding 32 causes a pulse to travel through the upper half 44 of the secondary winding 36 through the diode 46, to the juncture point 48, then through the coil 54 and to the positive power input of the audio amplifier unit 16. On the other half cycle, the pulse travels through the lower half 42 of the primary winding 32 to cause a pulse of current to flow through a lower half 50 of the secondary winding 36, through the diode 52 to the junction 48, through the coil 54 and also to the positive input terminal 58 of the audio amplifier unit 16. These duty cycle modulated pulses are "averaged" by the coil 54 and the capacitor 56. As indicated above the voltage at the positive power input terminal 58 of the amplifier unit 16 remains just slightly ahead of, and slightly greater than, the voltage of the audio signal.

The operation of the second power supply section 14 is substantially the same as that of the first section 12, except that the two diodes 46a and 52a are reversed so that only negative pulses are delivered to the negative power input terminal 58a.

Figure 2A:
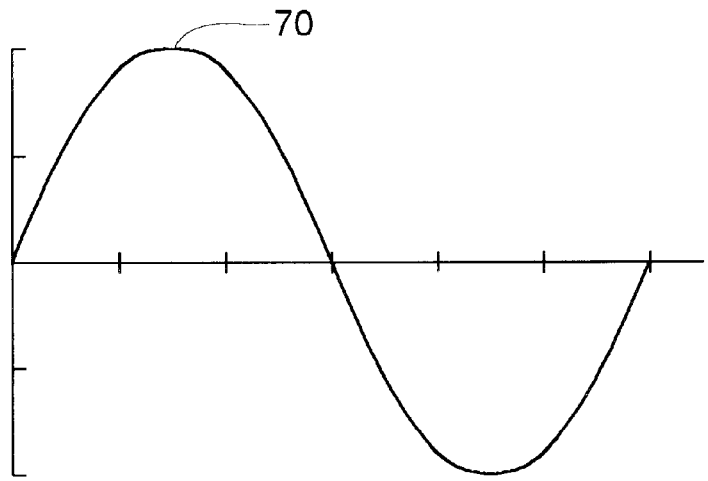
FIGS. 2A and 2B are diagrams illustrating the operation of the present invention, showing approximately the relative width of the pulses, corresponding to the amplitude of the audio signal.
Figure 2B:
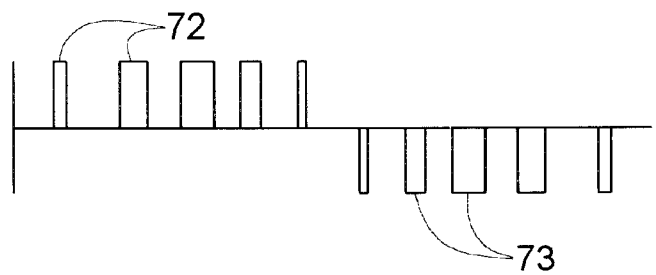

To further illustrate the operation of the present invention, reference is made to FIGS. 2A and 2B. A portion of an audio signal which is to be amplified is shown in FIG. 2A, this being shown simply as a portion of a sine wave 70. There is shown the positive and negative half cycles. In FIG. 2B there are shown the positive and negative pulses which are generated by the two power input sections 12 and 14, these pulses being designated 72 and 73, respectively. The pulses 72 are generated by the first power section 12, and the pulses 73 are generated by the second power section 14. It can be seen that the duration of the pulses is proportional to the amplitude of the audio signal.

Figure 3:
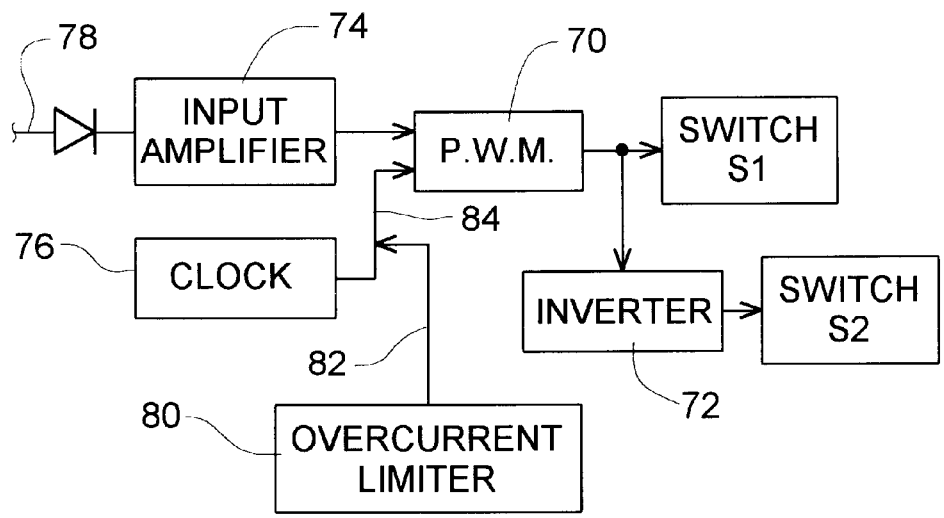
FIG. 3 is a schematic drawing of the circuit for the positive power supply of the amplifier.
Figures 1, 4B:
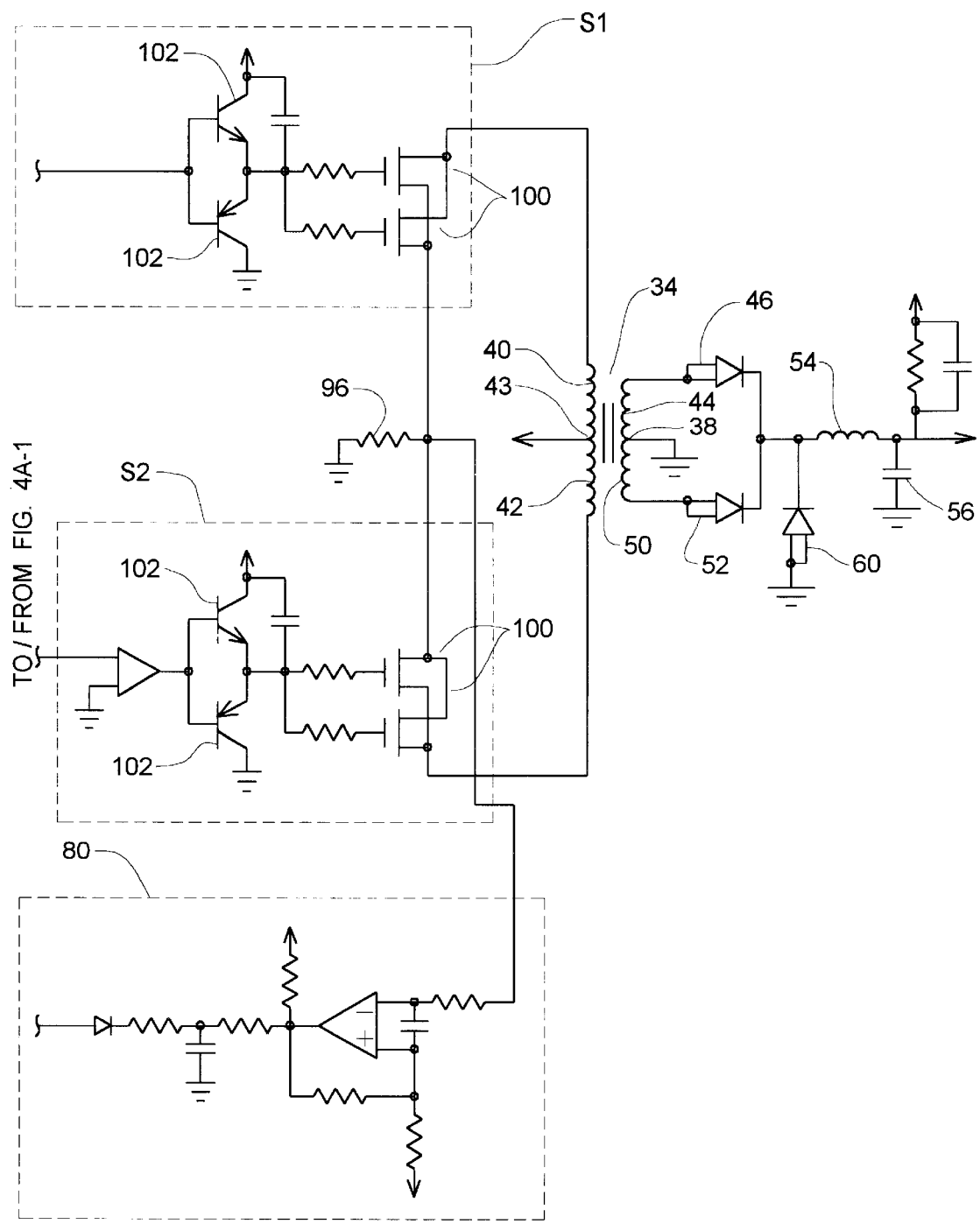

With the above description being given as a more general description, to describe the invention in more detail, reference is now made to FIGS. 3, 4A-1 and 4B-1, with FIG. 3 being a block diagram of the control circuit for the power section 12, and FIGS. 4A-1 and 4B-1 a circuit diagram illustrating in more detail the power section 12 of the present invention. As indicated previously, the two power sections 12 and 14 are nearly identical except that power section 12 provides the positive input to the amplifier 34 while the power section 14 provides the negative power input.

Figures 2, 4A:
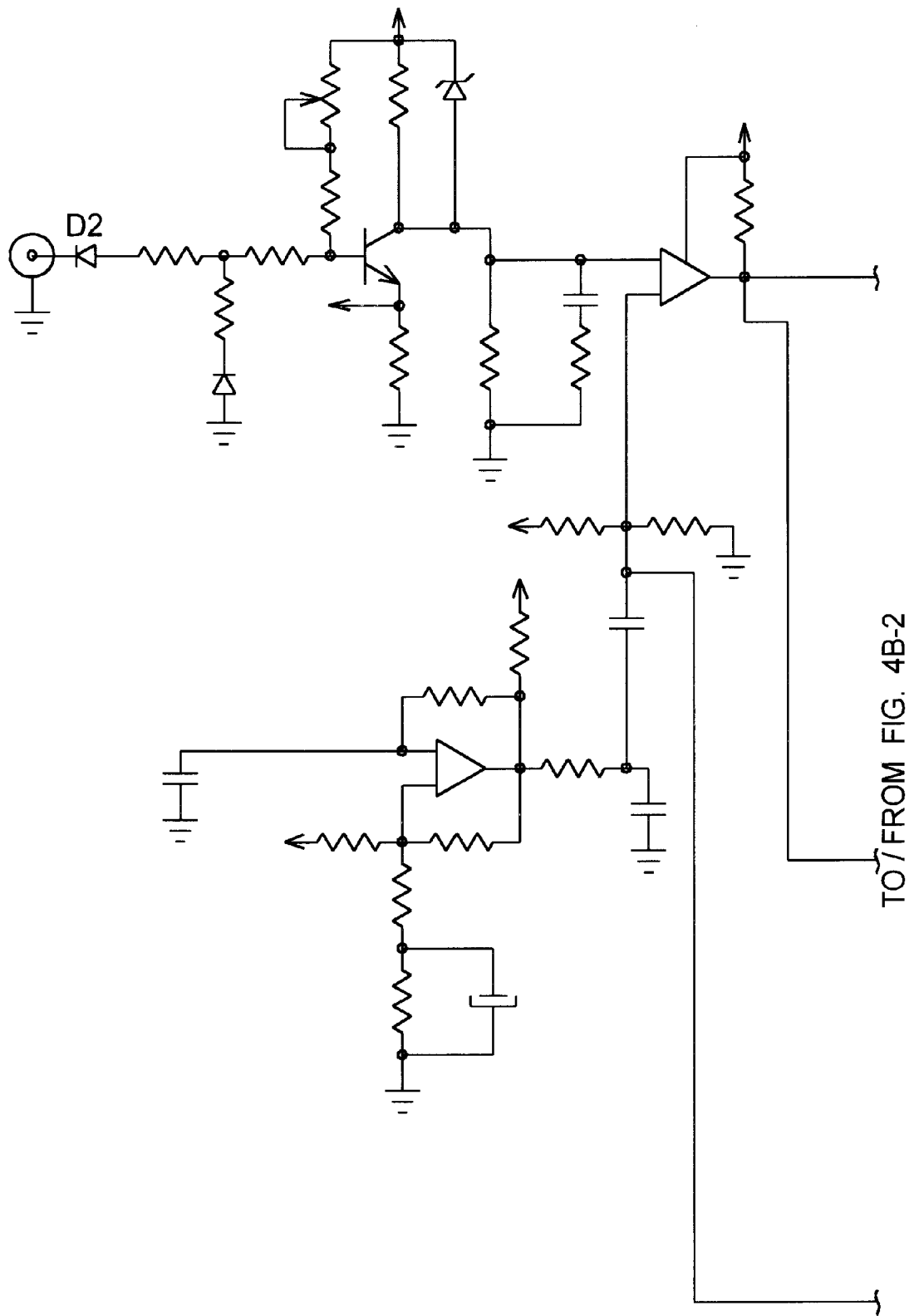
Figures 2, 4B:
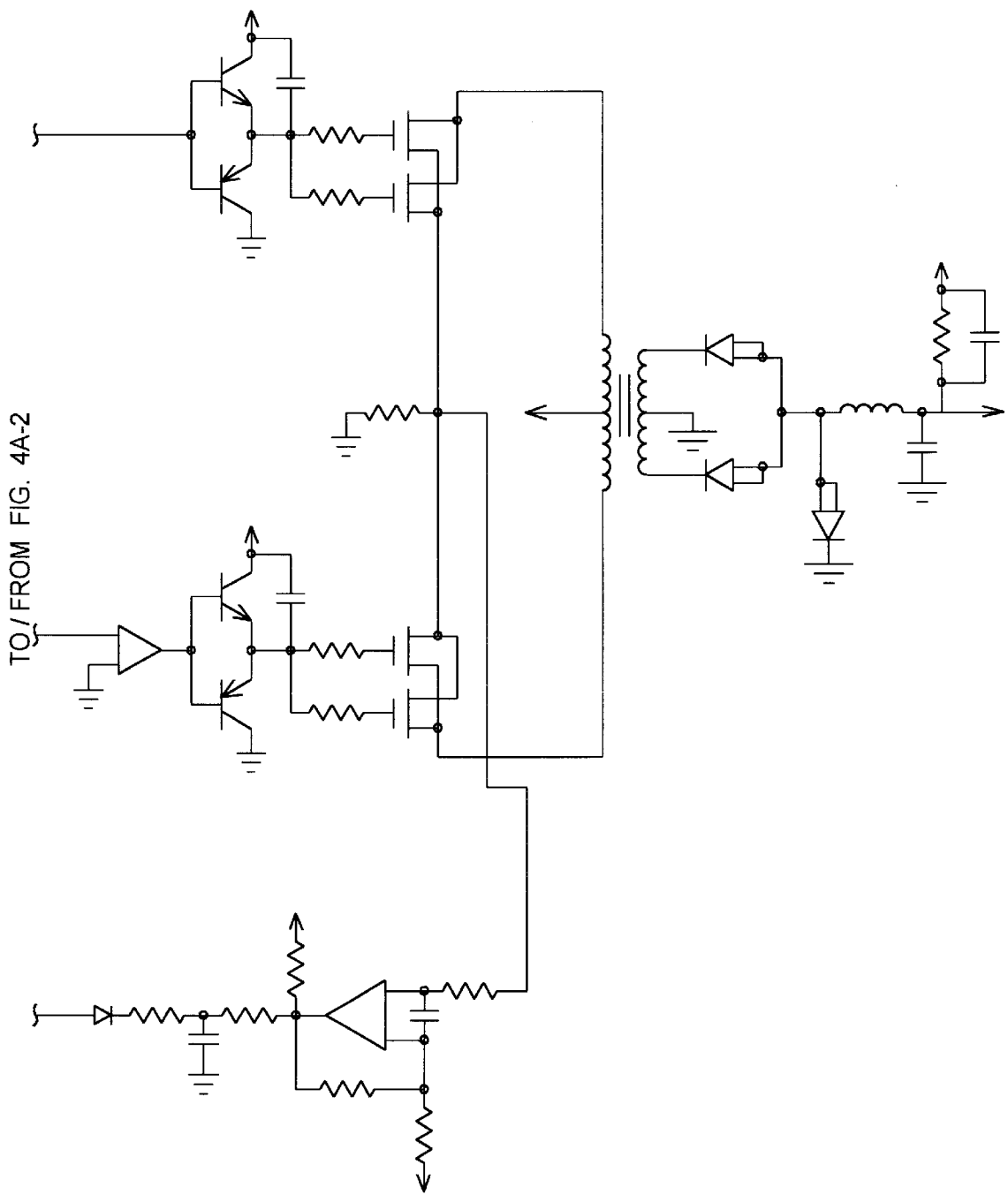

Accordingly, FIGS. 4A-2 and 4B-2 show the circuits of the negative power supply section 14, but no numerical designations are added. To relate FIG. 3 to FIG. 1, everything to the left of the transformer 34 in FIG. 1 appears in FIGS. 3, 4A1 and 4B1.

With reference to FIG. 3, the switch S1 is controlled by the pulse width modulator 70. This pulse width modulator 70 sends a control signal to the switch S1, and sends the same signal to an inverter 72 which in turn sends a control signal to the switch S2. The control signal sent by the inverter 72 is of the same magnitude and width as that sent to the switch S1, except that the timing is such that these two control switches operate alternately. Thus, first the control pulse is transmitted to the switch S1, and then to the switch S2, after which the next control power pulse is transmitted to the switch S1, and then to the switch S2, etc.

The pulse width modulator 70 in turn receives its input from two sources, namely the input amplifier 74 and the clock 76. The clock 76 sends regular pulses to the pulse width modulator 70 at 160 kHz. The input amplifier 74 is controlled by the audio input signal indicated 78. The input amplifier 74 transmits an amplified signal to the pulse width modulator 70, this signal being is proportional to the amplitude of the audio input signal. The pulse width modulator 70 then transmits a series of pulses, the width of which is proportional to the amplitude of the audio input signal.

There is also an overcurrent limiter 80 which has an operative connection (indicated by the line 82) to the input line 84 of the clock to block the signal inputs from the clock.

With reference to FIG. 4A-1, the input signal to the input amplifier 74 enters through the diode D1 so that it is rectified in a manner that only the positive going components of the audio signal are passed into the audio amplifier transistor 86, and the output from the transistor 86 is applied to the negative terminal 88 of the pulse width modulator 70.

The clock 76 is a comparitor operated with positive/negative feedback to make a series of pulses which are constant in amplitude and constant in duty cycle. This square wave pulse is integrated by a resistor 90 and a capacitor 92. This turns the clock pulses into a series of triangle waves which are then applied to the plus terminal 94 of the pulse width modulator 22.

The overcurrent limiter 80 comprises an overcurrent sensing resistor 96 (0.005 ohm) which senses the current passing through the transformer 34. If the current is too high, it will exceed a certain trip threshold which is set by a comparitor 98 of the overcurrent limiter 80.

The switch S1 comprises a pair of field effect transistors 100 which are in turn driven by a pair of bipolar transistors 102.

The negative power supply section 14 (shown in FIGS. 4A-2 and 4B-2) is constructed and operates in substantially the same way as the positive power supply 12, except that the diode in the input amplifier 74 and the diodes 46a, 52a and 60a (see FIG. 1) are reversed. Accordingly, there will be no detailed description of the circuitry of the power supply section shown in FIGS. 4A-2 and 4B-2.

There will now be a description of the amplifier 16, and reference is made to FIG. 5 and FIGS. 6A, 6B, 6C and 6E. Conceptually, the amplifier is illustrated in the block diagram of FIG. 5 where there is shown a pre-amplifier and gain stage section 106, a time delay 108, a mute transistor 110, a short circuit protection circuit 112 which controls the mute transistor 110, and the final power amplifier section 114.

Figure 6A:
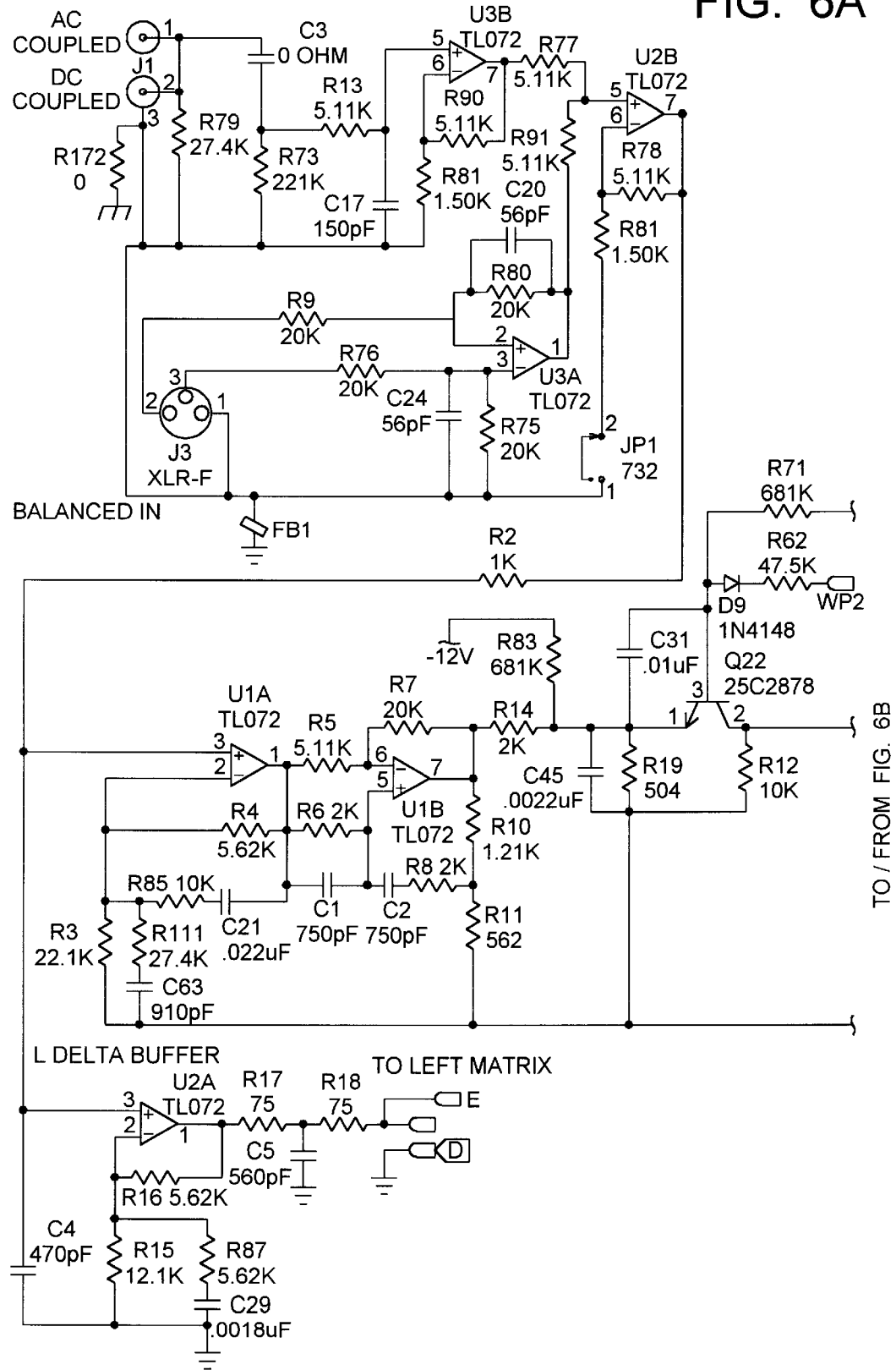
FIGS. 6A, 6B, 6C and 6D are a more detailed presentation of the circuitry of the power amplifier of the present invention.
Figure 6E:
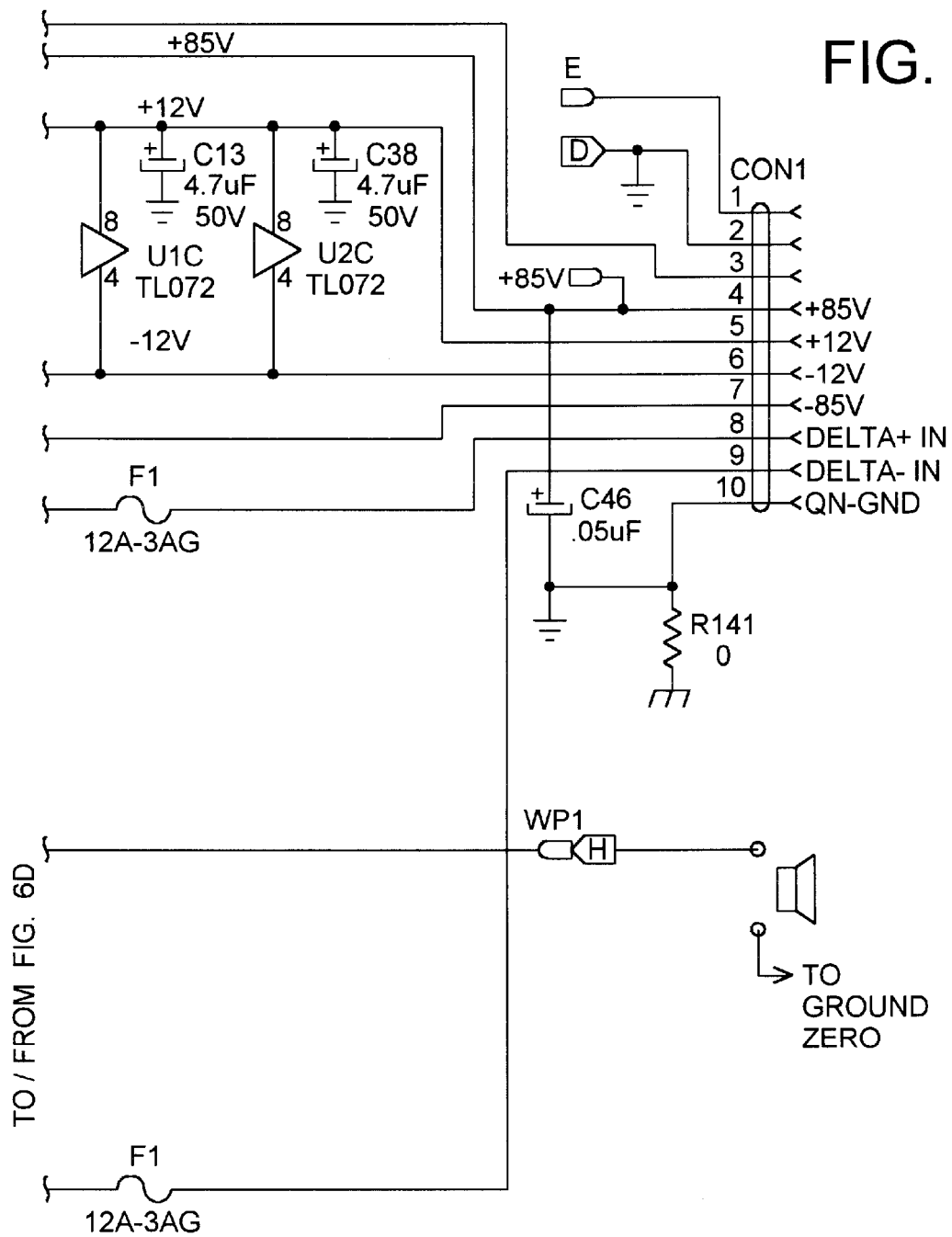

The specific circuitry of the amplifier is shown in FIG. 6A–E. In FIG. 6A there is shown the pre-amplifier and gain stages 106, and the mute transistor 110. In FIG. 6B, the short circuit protection circuit 112 is shown. The final power amplifier section 114 is shown in FIGS. 6C and 6E.

The input 116 to the pre-amplifier is an AC and DC coupled input which allows the use of pre-amplifiers which lack AC coupling. The input to the pre-amplifier goes through a series of three gain stages which together condition the signal so that the amplifier will clip properly. The output of the third gain stage goes to the time delay stage 108 which delays the signal approximately 10 microseconds. This is necessary because the power supply is slower than the amplifier, and since the signals need to be synchronized, there must be a time delay in the amplifier.

The output of the time delay goes through the mute transistor section. The output of this mute transistor 118 switches the amplifier on and off when it is plugged into the wall socket and when it is unplugged from the wall socket. When the amplifier is first plugged into the wall socket and powered up, the mute transistor holds the amplifier muted momentarily (about ¾ of a second). This allows the "thumps and bumps" that occur during power up not to be transmitted to the power amplifier. As indicated before, the circuitry for controlling the mute transistor is indicated at 112 in both FIG. 5 and also FIG. 6B.

The output from the mute transistor 110 goes to the input 120 of the final power amplifier. The power amplifier is shown in FIGS. 6C and 6E. Since this power amplifier is readily understandable from a review of the detailed circuit diagrams in FIGS. 6C and 6E, this will not be described in detail.

In the earlier part of this text, there has first been an overall description of the operation of the present invention with reference to FIGS. 1 and 2, a description of the mode of operation of the power sections 12 and 14 with reference to FIGS. 3, 4A-1, 4B-1,4A-2 and 4B-2, and also a description of the operation of the amplifier section with reference to FIGS. 5 and 6A–E. Therefore, those will not be repeated in detail, but only summarized. Then this will be followed by some general comments on the operation and advantages of the present invention.

The audio signal is simultaneously entered at three places in the overall system, namely at the two input diodes D1 and D2 which connect to the power sections 12 and 14, and also to the input 62 to the amplifier unit 16. The audio signal introduced to the two power sections 12 and 14 is used to enable these two power sections 12 and 14 to provide to the amplifier 16 positive and negative power inputs which are about 4 volts above and below, respectively, the positive and negative input terminals 58 and 58A to the amplifier unit 16.

More specifically, the audio signals transmitted into the diodes D1 and D2 are used in their respective power supply systems to control the width of the pulses transmitted from the pulse width modulators 22 and thus control the width of the pulses transmitted from the switches S1–S4 to the two transformers 34 and 34a of the two power sections 12 and 14. The operation by which this accomplished is described in more detail previously herein.

At this point, attention is now directed to the operation of each transformer 34 and 34a in connection with their related coil 54 and 54a and capacitor 56 and 56a. It should be kept in mind that the frequency of the pulses is 160 kHz, and audio signals are at 20 kHz or below. Let us now examine the operation of the power section 12. The pulses transmitted through the switches S1 and S2 are square wave pulses, and thus the pulses which are directed to the inductance coil 54 are also square wave pulses. The capacitor 56 is maintained at a voltage which tracks the voltage of the audio signal, and more specifically is about 4 volts above that of the audio signal.

Let us assume that at a certain instant, the capacitor 56 is at 25 volts, and the audio signal very abruptly increases in amplitude. This same audio signal would be sending its inputs to the pulse width modulators 70 and 70a of the two power sections 12 and 14, so that the width of the pulse is being transmitted through the transformer 34 would also increase in width. As these pulses are transmitted through the coil 54, the voltage of the current passing from the coil 54 rises above the voltage level in the capacitor 56 so as to change the capacitor 56 to a higher voltage.

At the same time, however, since the amplifier is now drawing more current, electrons are being drawn away from the capacitor 56. There is a feedback loop which provides a proper control so that if the voltage level at the capacitor 56 drops below the desired level, then the pulse width modulators only one of which is shown at 70 increase the width of the pulses yet further. On the other hand, if the voltage on the capacitor 56 is going above the desired level (i.e. greater than approximately 4 volts above the audio signal), then the feedback loop would cause the pulse width modulator 70 or 70a to send pulse signals of narrower width. The net result is that the voltage at the capacitor 56 or 56a is changed in very short time increments so that the voltage level at the capacitors 56 and 56a of the two power supply sections 12 and 14 changes rapidly and accurately so that they are able to track the audio signal very closely.

It has been found that this amplifier 10 is able to operate at very high power output (2,000 watts or more) and operate very efficiently so that relatively little heat is dissipated. Also, the power supply is designed so that its size and weight can be greatly reduced relative to prior art tracking amplifiers of comparable power output.

Figure 7:
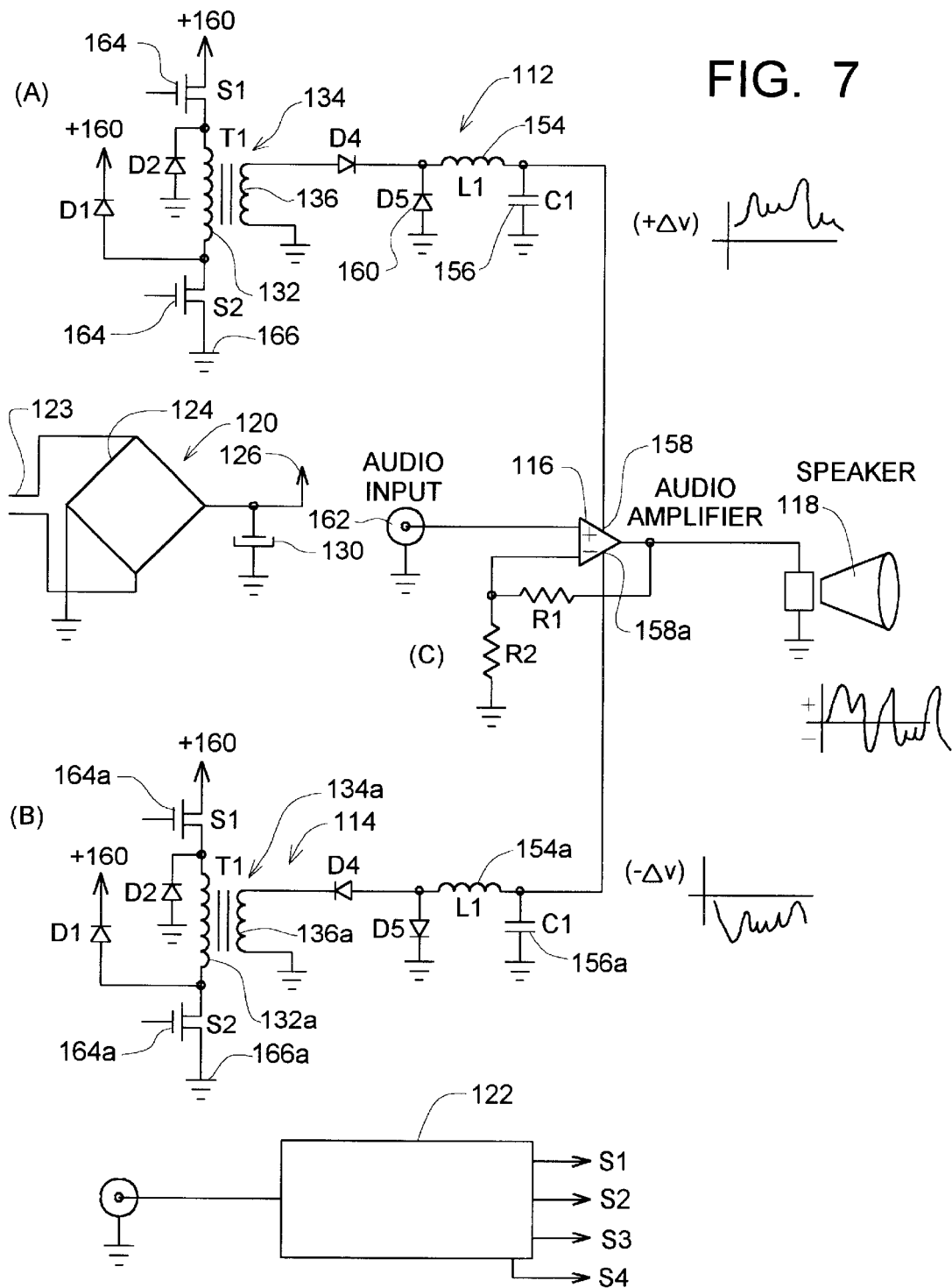
FIG. 7 is a schematic drawing of a second embodiment of the present invention.

The second embodiment of the present invention is a later embodiment, and it will now be described with reference to FIGS. 7 and 8. As shown in FIG. 7, the overall arrangement of this second embodiment is similar to the first embodiment (shown in FIG. 1) in that there are the first and second power sections 112 and 114, which supply power to the amplifier unit 116, that in turn powers the speaker 118. As in the first embodiment, the two power sections 112 and 114 supply positive and negative power inputs, respectively, to the amplifier unit 116 as indicated at 158 and 158a, and there is an audio input 162 to the amplifier unit 116.

There is a power source 120 and also a pulse with modulator control unit 122. The power source 120 connects to a wall plug at 123, and the rectifier border 124 supplies positive DC power at 126, there is a capacitor 130 to minimize the variations in the DC output.

The second embodiment differs from the first embodiment in the design and operation of the two power units 112 and 114. As in the first embodiment, the two power sections 112 and 114 are substantially identical except that the power section 114 delivers the negative voltage/power to the amplifier 158. Therefore, only the first power section 112 will be described in detail herein with the understanding that this in large part would apply to the second power section 114.

As in the first embodiment, the power section 112 comprises a transformer 134 having the primary winding 132 and the secondary winding 136. The power section 112 differs from the power section 12 of the first embodiment in that the primary winding 132 of the transformer 134 has the upper end thereof connected by a first transistor 164 (which is switch S1) to the 160 volt positive power source 126, and the other end of the primary winding 132 is connected to the second transistor 164 (switch S2) to ground at 166. This overall arrangement can be characterized as a double ended tracking down converter. These two transistors 164 open at the same time and close at the same time at high frequencies (e.g. 100 kHz), thus forming square wave pulses that go through the primary winding 134. At the same time that the current is going though the primary winding 132, the current is also flowing through the secondary winding 136 through the diode D4 into the capacitor C1, and into the audio amplifier input at 158, with this current ultimately going to the speaker 118.

Now when the transistors 164 (S1 and S2) are simultaneously turned off, the voltage across the primary winding 132 immediately flips direction and the upper end of the primary winding 132 has a path through the diode D2 to ground. The lower end of the transformer primary winding 132 is clamped by the diode D1 to the 160 volt power source. Therefore, with the transformer primary flipping by 160 volts, the voltage in the secondary winding 136 also "flips" so the upper end of the secondary winding 136 goes to negative 160 volts. This turns off the diode D4 and the current that had been flowing in the coil 154 just prior to turn off by the two switches S1 and S2 forces the diode D5 to turn on since the coil 154 "flips" in that the end of the coil 154 that connects to the diode D5 tries to go below ground, thus turning the diode D5 on. So the current continues to flow and complete a circuit of D5, coil 154, to the amplifier unit 116.

To turn our attention now to the second power section 114, the operation of the second power section 114 is substantially the same as the first power section 112, except that the diodes D4 and D5 of the power section 114 are reversed in polarity, and instead of generating a positive voltage, it generates a negative voltage.

It is to be understood that the control signal for the first power source 112 is derived form the positive portion of the audio signal, and the control signal for the second power section 114 is derived form the negative portions of the audio signal.

Figure 8:
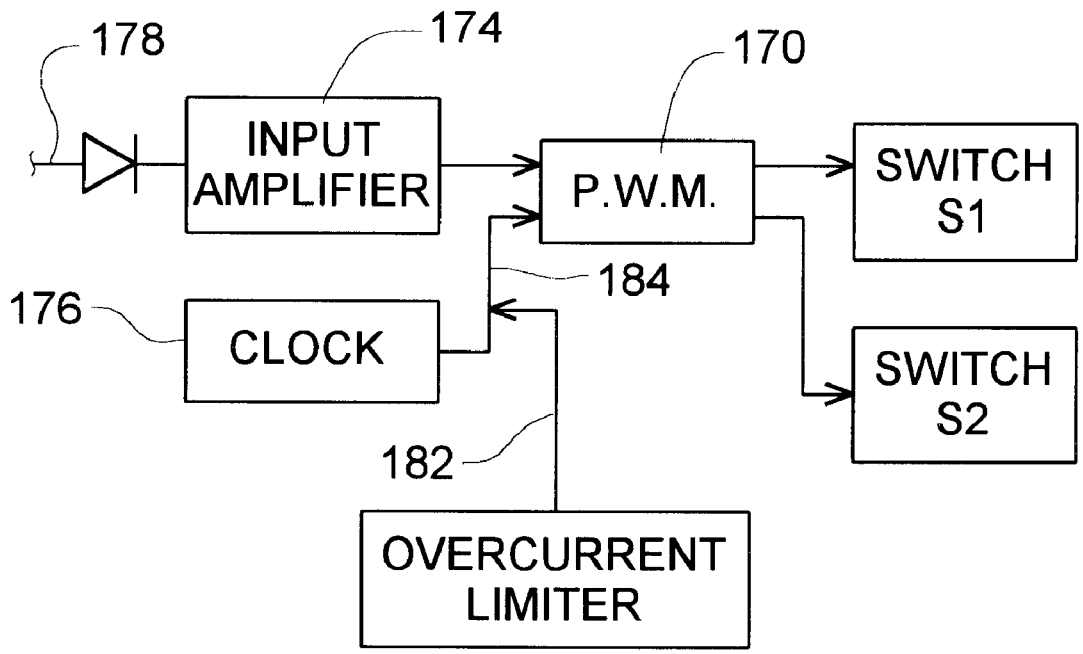
FIG. 8 is a schematic drawing of the circuit for the positive power supply of the second embodiment of the amplifier.
Figure 9A:
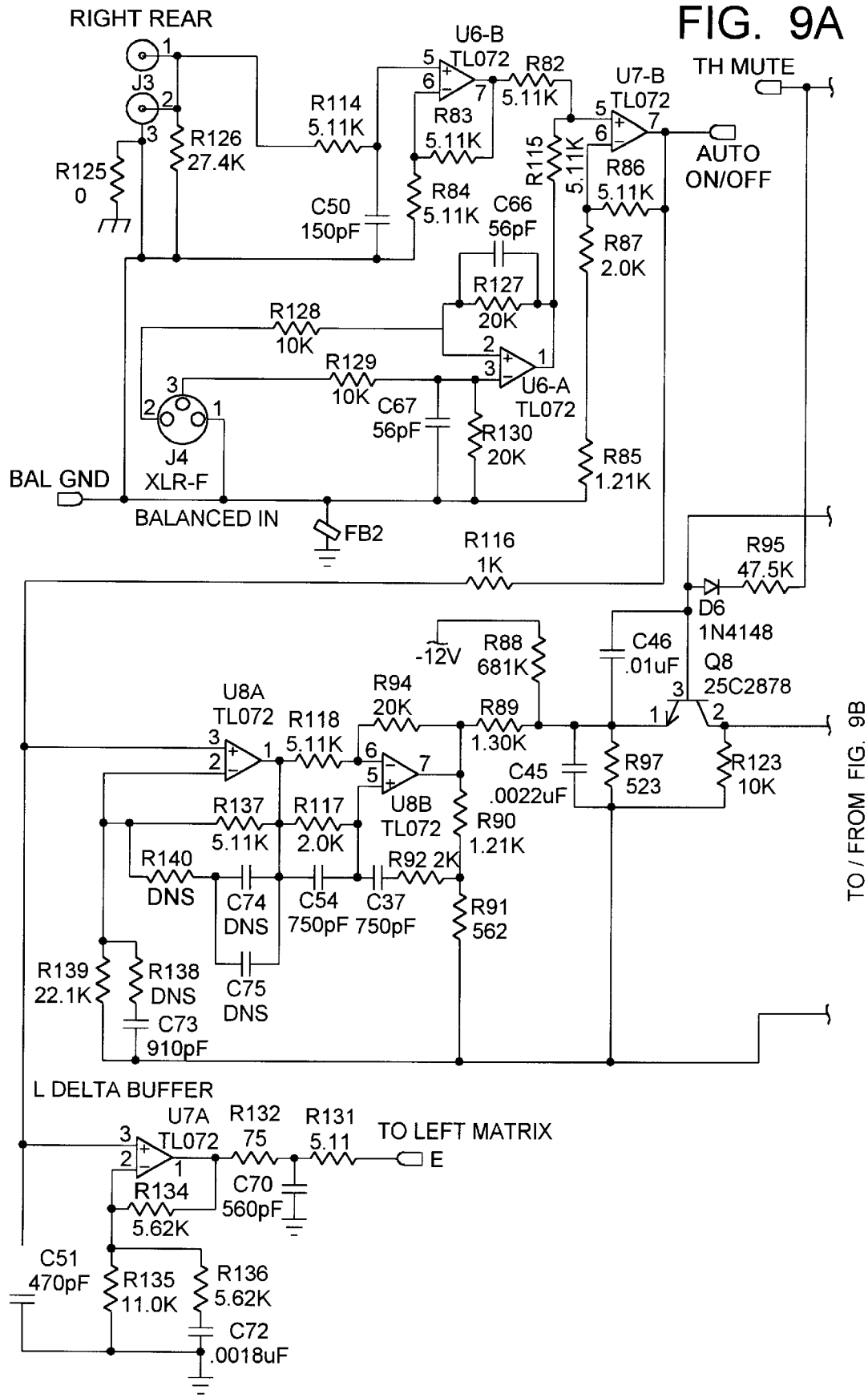
FIGS. 9A–9C are more detailed presentation of the circuitry of the amplifier unit utilized in this second embodiment.
Figure 9C:
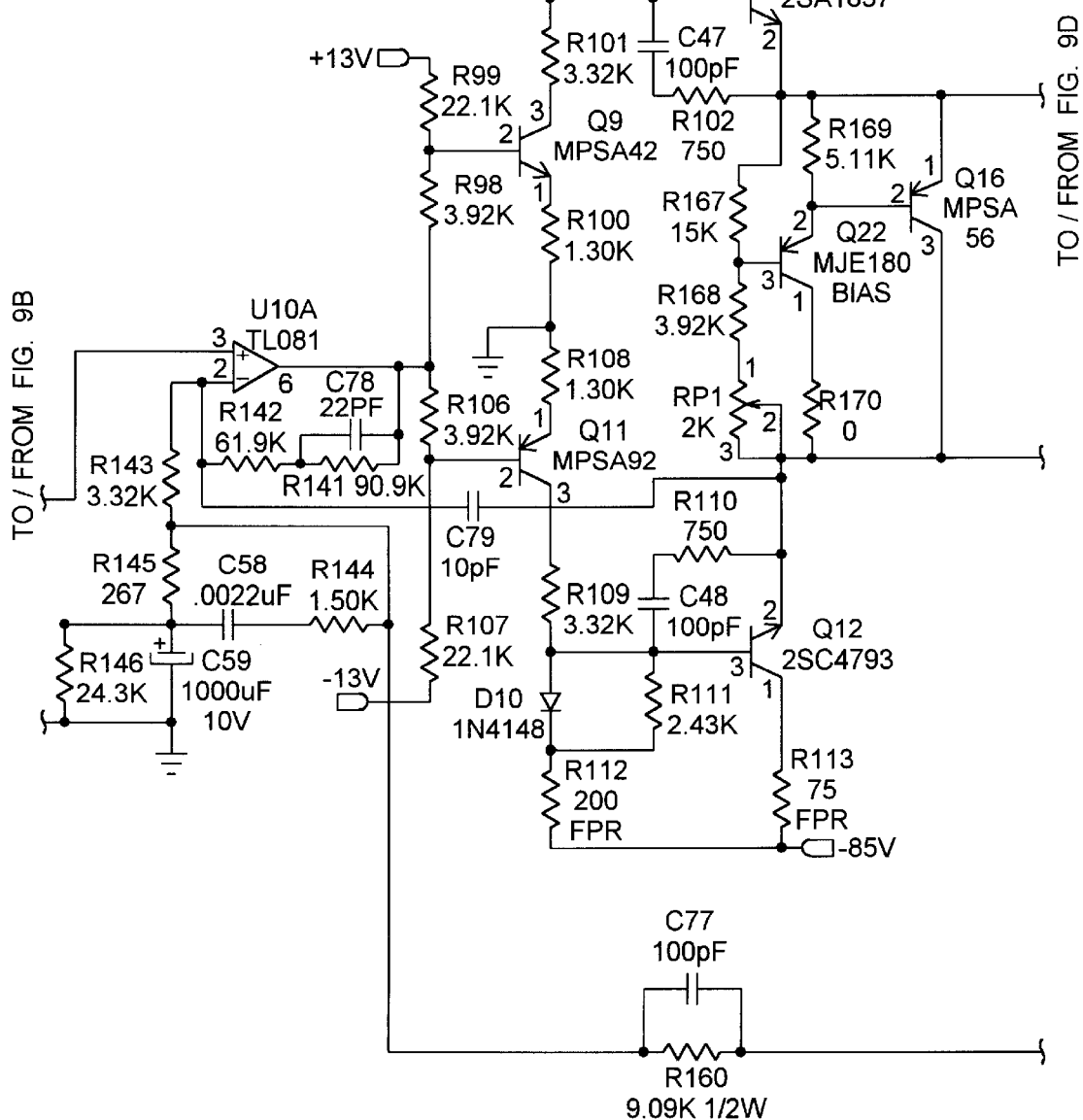
Figure 9D:
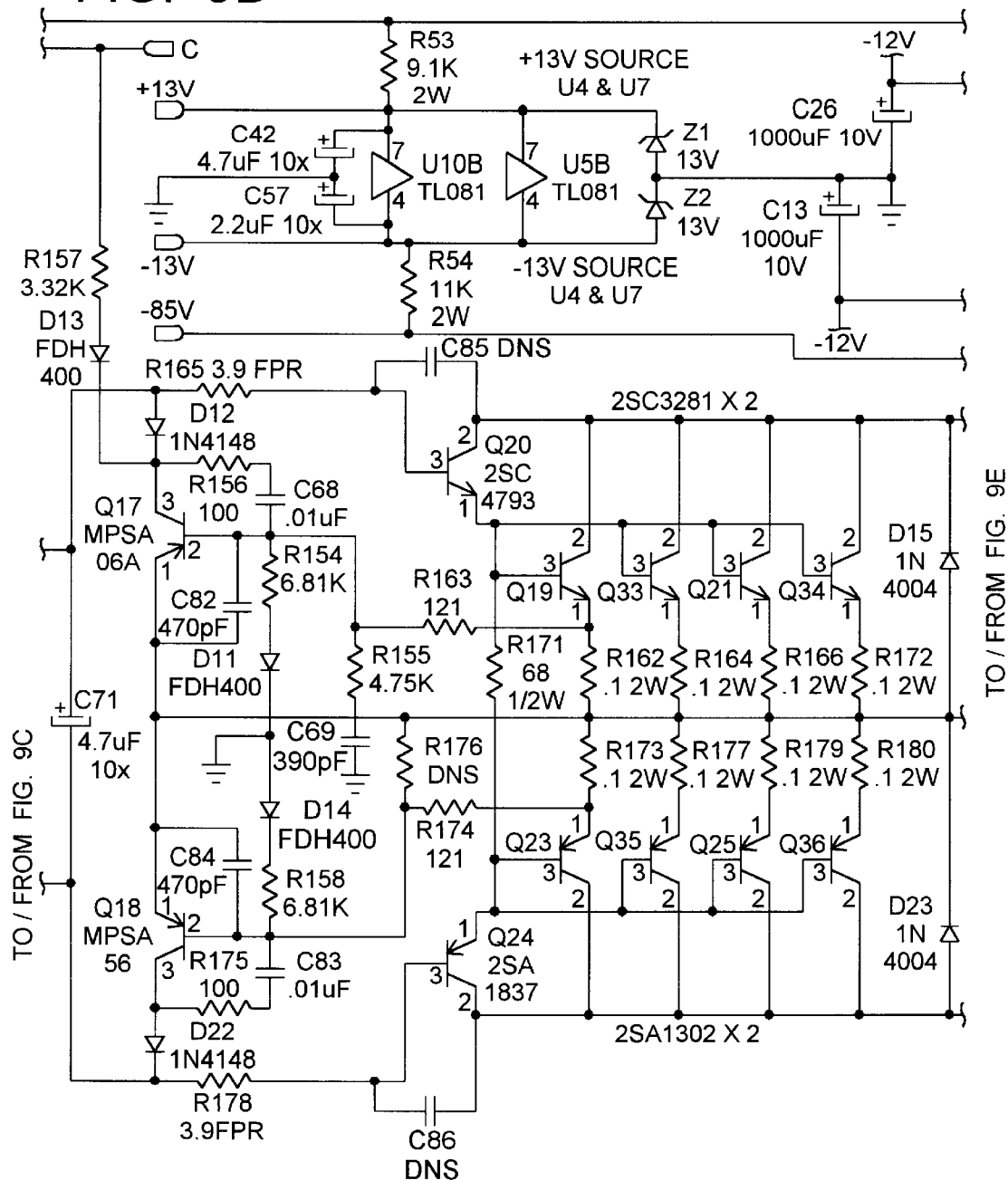
Figure 9E:
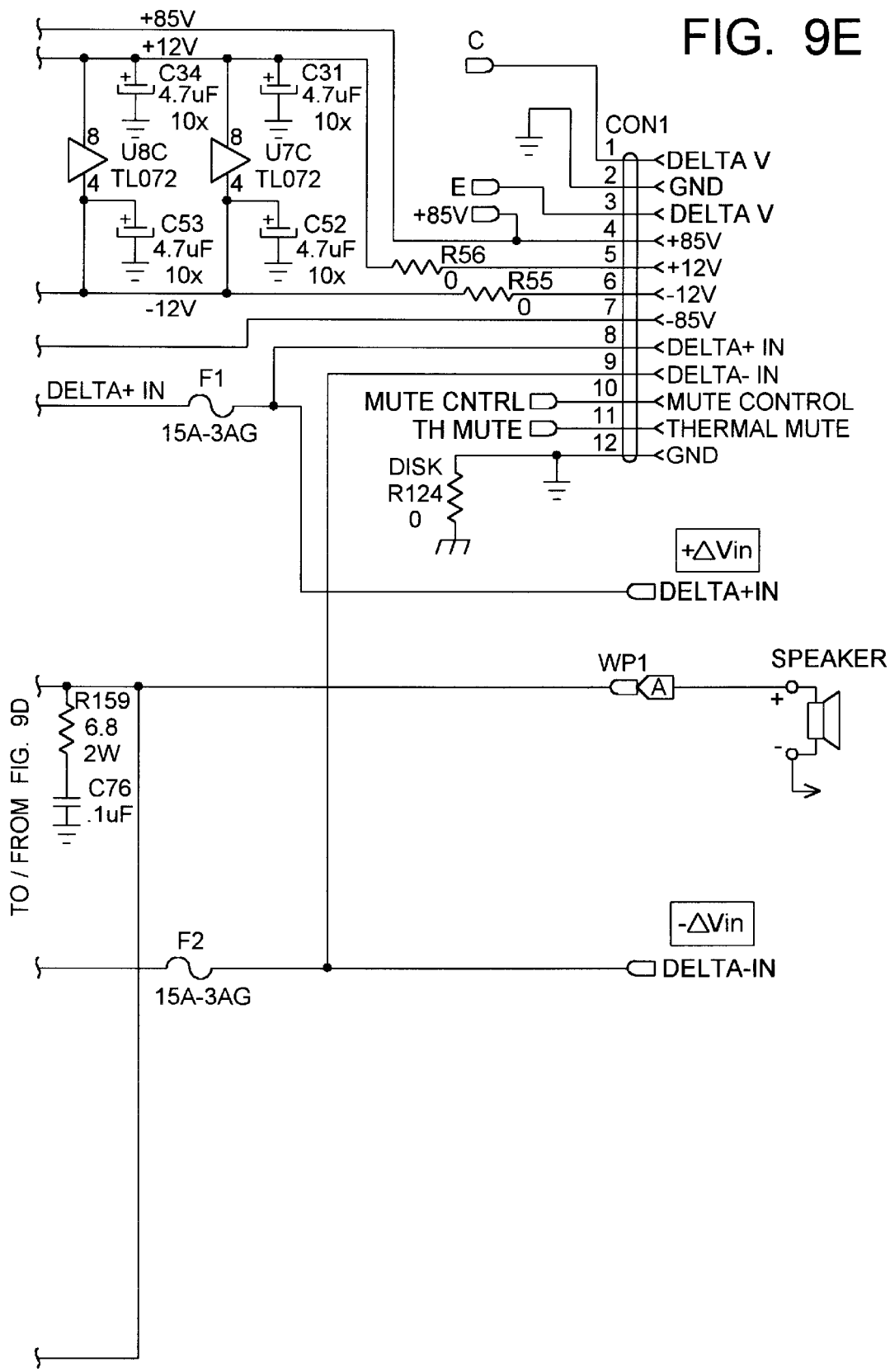

FIG. 8 of the second embodiment corresponds to FIG. 3 of the first embodiment, and is a schematic drawing of the circuit for the positive power supply 112 of the second embodiment. As in the first embodiment, there is a pulse width modulator 170, which receives its input from the input amplifier 174 and the clock 176. The input amplifier 174 in turn receives this input from the audio signal source at 178. Also, there is the over current limiter 180, which connects to the line 182 to the line 184 between the clock 176 and the pulse width modulator 170.

However, the diagram of FIG. 8 differs from that of FIG. 3 in that the inverter 72 of the first embodiment is eliminated, and the pulse width modulator 170 is connected directly to the switches S1 and S2. Reason for this is that the pulse width modulator 170 turns the switches S1 and S2 off and on simultaneously.

To review now the overall operation of the second embodiment, when the audio signal is very small, the two switches 164 (S1 and S2) (FIG. 7) are turned on only for a very short period of time, perhaps only $\frac{1}{20}$ of the half period of 100 kHz. Now when the signal becomes larger the duty cycle is increased, and the a full power audio signal, the transistors 164 (S1 and S2) are turned on for half of the duty cycle (half of a full period).

When the transistors 164 (S1 and S2) are turned on, 160 volt current flows down the lead from the switch S1 through the primary winding 132 at the transformer 134 and through the lower switch S2 to ground at the same time, the current is flowing in the secondary through the diode D4, and into the capacitor 156 to the audit amplifier 116. Then when the two switches (S1 and S2) turn off simultaneously, as described previously in the description of the second embodiment, the transformer windings 132 and 134 "flip", and the upper and lower ends of the primary winding 132 discharge through the two diodes, D1 and D2, respectively.

The basic design of the circuitry shown FIGS. 6A through 6D of the first embodiment can be employed in the second embodiment, with the necessary modifications to operate as indicated above, so no detailed description of the circuitry will be given. The pulse width modulator 122 and the power sections 112 and 114 can be substantially the same as, or similar to those of the first embodiment. As a further alternative, there is shown in FIG. 9 a later design of the amplifier 116. Since the circuitry of this amplifier 116 is shown in sufficient detail so as to be readily understandable to the ordinary skill in the ark?, a detailed description of this will not be repeated in this text.

Figure 10:
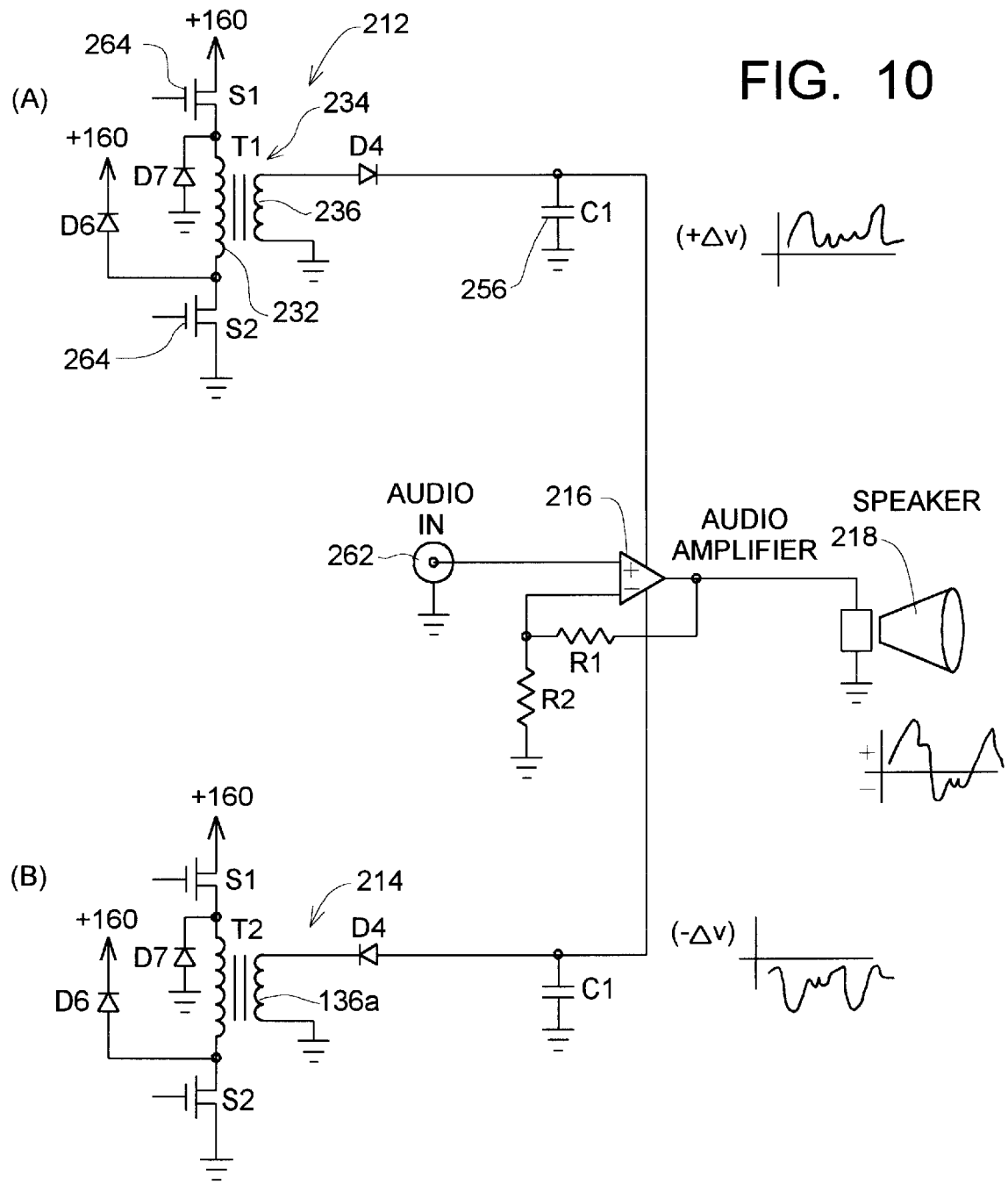
FIG. 10 is a schematic drawing of a third embodiment of the present invention.

A third embodiment is shown in FIG. 10. It can be seen in that the basic components of this third embodiment are the same as, or similar to, those of the second embodiment, but with certain variations. There are two power sections 212 and 214 supplying power to the amplifier unit 216, which in turn connects to the speaker 218, and to the audio input 262. In the positive power section 212 there is the transformer 234 with the primary and secondary windings 232 and 236, respectively. There are the two transistors 264 each of which comprises one of the switches S1 and S2.

However, the third embodiment differs in several ways. First, the polarity of the two windings 232 and 236 are reversed from one another, and this in indicated somewhat schematically, showing a dot at the top of the secondary winding 236, and a second dot adjacent to the lower end of the primary winding 232. Also, the inductance coil 154 and the diode D5 of the second embodiment are eliminated. The reason for this is the function of the inductor 154 of the second embodiment is actually "built into" the transformer 234 as will explain the flow.

In this third embodiment, as in the second, the transistors 264 (i.e. switches S1 and S1) are turned on and off simultaneously. When the switches S1 and S2 are turned on, current flows from the 160 volt source through the switch S1 through the primary winding 232 and through the switches S2 to ground. However, during the time period when current is flowing through the primary winding 232 no current is flowing through the winding 236. Thus, the magnetic field builds up around the primary winding 232 so that the energy is stored in the magnetic field surrounding the transformer. Then when the switches S1 and S2 (264) open, the magnetic field collapses. This induces voltage in the secondary winding 236, to cause current to flow from the secondary winding 236 through the diode D4 into the capacitor 256 and to the amplifier 216.

It is readily understood that the operation of the second power section 214 is substantially the same as the first power section 212 except that a diode D4 of the power section 214 is reversed relative to the corresponding diode of the first section 212, and negative voltage is directed is directed to the amplifier 216.

It is believed that the various details of the operation of this second embodiment and the specific details of the circuitry thereof are readily understandable from the earlier text in this present application, so these will not be repeated in this portion of the text. It is also to be understood that various modifications could be within the present venture without departing from the basic teachings thereof.

It is to be understood that various modifications can be made without departing from the basic teachings of the present invention.

Now therefore, I claim:

1. An audio amplifier comprising:
   a) a power amplifier section which receives an audio input signal and positive and negative power inputs to produce an audio output;
   b) a power supply comprising a positive power supply section and a negative power supply section;
   c) said positive power supply section comprising:
      i. first transformer having a primary and a secondary winding, with the secondary winding being operatively connected to said power amplifier section to supply positive voltage power in part to the power amplifier section;
      ii. a first power switch section to supply current pulses to the primary winding;
      iii. a first filter circuit component connected to an output of said secondary winding of the first transformer to maintain voltage of the positive power output as a continuing variable voltage input;
   d) said negative power supply section comprising:
      i. a second transformer having a primary and a secondary winding, with the secondary winding being operatively connected to said power amplifier section to supply negative voltage power input to the power amplifier section;
      ii. a second power switch section to supply current pulses to the primary winding;
      iii. a second filter circuit component connected to an output of said secondary winding of the second transformer to maintain the voltage of the negative power output as a continuing variable voltage input.
   e) control circuit section responsive to an audio input signal to transmit pulse control signals to the first and second power switch sections in a manner to control the first and second power switch sections so that the power of the current pulses delivered to the primary windings has a proportional relationship to the strength of the audio signal so that the positive and negative voltage inputs to the amplifier section track the audio signal in a manner to maintain the positive and negative input voltages at a predetermined level range above and below voltage of the audio input.

2. The amplifier as recited in claim 1, wherein each power switch section comprises two switches connected to opposite ends of the primary winding of its related transformer.

3. The amplifier as recited in claim 2, wherein the switch section for each of said positive and negative power supply sections is arranged so that a first portion of the pulses pass through one of said switches and through the related primary winding of one direction, while a second portion of the pulses pass through the other of the switches and through the related primary winding in an opposite direction.

4. The amplifier as recited in claim 3, wherein there is an intermediate circuit connection between first and second ends of each primary winding to provide a first portion of the primary winding between the first end of the primary winding and the intermediate circuit connection and a second portion of the primary winding between the second end of the primary winding and the intermediate circuit connection, said first portion of the pulses flowing between one of said switches and through the intermediate circuit connection through the first portion of the primary winding, and the second portion of the pulses flowing between the other of said switches and said intermediate circuit connection through the second portion of the primary winding.

5. The amplifier is recited in claim 4, wherein the intermediate circuit connection of each of said primary windings is connected to a power source.

6. The amplifier as recited in claim 5, wherein the secondary winding of each transformer is connected to ground at an intermediate location of each secondary winding.

7. The amplifier as recited in claim 2, wherein the secondary winding of each transformer is connected to ground at an intermediate location of each secondary winding.

8. The amplifier as recited in claim 3, wherein each secondary winding has two end connections and first and second diodes to receive an output at each of said end connections with the output of the diodes being directed to the power amplifier section.

9. The amplifier as recited in claim 8, wherein each of the filter circuit components of the two power supply sections comprises an induction coil to receive the output of the secondary winding, and a capacitor connected at a location between the induction coil and the amplifier section.

10. The amplifier as recited in claim 1, wherein each of the filter circuit components of the two power supply sections comprises an induction coil to receive the output of the secondary winding, and a capacitor connected at a location between the induction coil and the amplifier section.

11. The amplifier as recited in claim 3, wherein said first portion and second portion of the pulses flow through the related primary winding in an alternating fashion, by closing said switches of each power section alternately.

12. The amplifier as recited in claim 1, wherein each power switch section comprises first and second switches in series with its primary winding, at first and second opposite ends, respectively, of said primary winding, said amplifier and said control circuit being arranged so that the first and second switches of each power supply section open substantially simultaneously and close substantially simultaneously to cause the pulses to be transmitted through the primary winding.

13. The amplifier as we cited in claim 12, wherein the secondary winding of each power supply section is connected to a first diode that in turn connects to the power amplifier section to enable the pulses generated in the secondary winding to travel through the first diode to the power amplifier section.

14. The amplifier as recited in claim 13, wherein the transformer and the first diode of each power supply section are arranged to transmit pulses so that current pulses flow through the primary winding and secondary winding of each power supply section substantially simultaneously.

15. The amplifier as cited in claim 14, where each filter component comprises a capacitor connected between the first diode of each power supply section and the power amplifier section.

16. The amplifier as cited in claim 15, wherein an induction coil is connected between the first diode of each power supply section and the capacitor of each power supply section.

17. The amplifier as recited in claim 16, where there is for each power supply section a second diode positioned between the induction coil and said first diode and arranged to be non conductive when the first diode is transmitting a pulse, and to be conductive when said first diode is turned off.

18. The amplifier as recited in claim 12, herein said transformer of each power supply section is arranged in a manner that when the first and second switches of each power supply section are closed and a pulse of current flows through the primary winding of the transformer of that power supply section, current is not flowing in the secondary winding, and after the first and second switches are opened, a collapsing field of the primary winding induces a current to flow through the secondary winding of that power section.

19. The amplifier as recited in claim 18, wherein there is a diode connected between the secondary winding of each power supply section and the power amplifier section to permit current from the secondary winding to flow to the power amplifier section after the current pulse has passed through the primary winding and the current pulse is induced the secondary winding.

20. The amplifier as recited in claim 19, wherein said filter circuit of each power supply section comprises a capacitor which is connected between its related power amplifier section.

21. The amplifier as recited in claim 12, wherein the first switch of each power supply section connects to a power source, and the second switch connects toward a ground connection, a first diode is connected from a location between the first end of the primary winding and the first switch toward a ground location.

22. The amplifier as recited in claim 21, wherein there is a second diode connected from a location between the second end of the primary winding of each power supply section and the second switch and connected toward a power connection.

23. The amplifier as recited in claim 12, wherein said power supply comprises a power source which delivers DC power to each of said power supply sections.

24. The amplifier as recited in claim 23, wherein said DC power source delivers power at a substantially constant voltage to both said positive and negative power supply sections.

25. The amplifier as recited in claim 24, wherein said power source comprises a rectifier adapted to be connected to a source of alternating current, and a storage capacitor.

26. The amplifier as recited in claim 23, wherein the control circuit comprises a pulse width modulator circuit portion which receives a clock input to initiate successive pulse signals, and having an audio signal input to said pulse width modulator circuit portion to cause said pulse width modulator circuit portion to transmit to the power supply section pulse signals having a pulse width with a proportional relationship to said audio signal.

27. The amplifier as recited in claim 1, wherein the control circuit comprises a pulse width modulator circuit portion which receives a clock input to initiate successive pulse signals, and having an audio signal input to said pulse width modulator circuit portion to transmit to the power supply section pulse signals having a pulse width with a proportional relationship to said audio signal.

28. The amplifier as recited in claim 1, wherein said control circuit section comprises a first control circuit portion which receives positive portions of the said audio signal and generates pulse control signals corresponding to the positive audio signal portions and a second control circuit portion which receives negative portions of the audio signal and utilizes the negative portions of the audio signal to produce pulse control signals to control pulses for the negative power supply section.

\* \* \* \* \*